(12) United States Patent
Itonaga

(10) Patent No.: US 9,070,609 B2
(45) Date of Patent: Jun. 30, 2015

(54) SOLID-STATE IMAGING DEVICE, MANUFACTURING METHOD THEREOF, AND ELECTRONIC APPARATUS

(75) Inventor: Kazuichiro Itonaga, Tokyo (JP)

(73) Assignee: SONY CORPORATION (JP)

( * ) Notice: Subject to any disclaimer, the term of this patent is extended or adjusted under 35 U.S.C. 154(b) by 352 days.

(21) Appl. No.: 12/860,251

(22) Filed: Aug. 20, 2010

(65) Prior Publication Data

US 2011/0049590 A1    Mar. 3, 2011

(30) Foreign Application Priority Data

Aug. 28, 2009  (JP) .................................. 2009-198119

(51) Int. Cl.
*H01L 27/146* (2006.01)

(52) U.S. Cl.
CPC ..... *H01L 27/14603* (2013.01); *H01L 27/14621* (2013.01); *H01L 27/14627* (2013.01); *H01L 27/14643* (2013.01); *H01L 27/14685* (2013.01); *H01L 27/14689* (2013.01); *H01L 27/14641* (2013.01)

(58) Field of Classification Search
CPC .............. H01L 27/1463; H01L 27/146; H01L 27/14643; H01L 27/14603; H01L 27/14601
USPC ............ 256/292, E31.097; 257/292, E31.097
See application file for complete search history.

(56) References Cited

U.S. PATENT DOCUMENTS

| | | | |
|---|---|---|---|
| 7,977,717 B1* | 7/2011 | Innocent | 257/292 |
| 2003/0209712 A1* | 11/2003 | Fujita et al. | 257/72 |
| 2004/0201047 A1* | 10/2004 | Takamura | 257/292 |
| 2005/0087672 A1* | 4/2005 | Kuwazawa et al. | 250/208.1 |
| 2006/0028567 A1* | 2/2006 | Kuwazawa | 348/294 |
| 2006/0289911 A1* | 12/2006 | Lee et al. | 257/292 |
| 2007/0084986 A1* | 4/2007 | Yang et al. | 250/208.1 |
| 2008/0258187 A1* | 10/2008 | Ladd et al. | 257/292 |
| 2009/0014628 A1* | 1/2009 | Sakano et al. | 250/208.1 |
| 2010/0039546 A1* | 2/2010 | Cohen et al. | 348/308 |
| 2010/0097508 A1* | 4/2010 | Yanagita et al. | 348/301 |
| 2010/0176423 A1* | 7/2010 | Sugawa et al. | 257/225 |
| 2011/0025894 A1* | 2/2011 | Seko | 348/294 |

FOREIGN PATENT DOCUMENTS

| | | |
|---|---|---|
| JP | 2003-031785 | 1/2003 |
| JP | 2004-172950 | 6/2004 |
| JP | 2006-054276 | 2/2006 |
| JP | 2006-157953 | 6/2006 |
| JP | 2009-135319 | 6/2009 |

* cited by examiner

*Primary Examiner* — Wael Fahmy
*Assistant Examiner* — Sarah Salerno
(74) *Attorney, Agent, or Firm* — Sheridan Ross P.C.

(57) ABSTRACT

A solid-state imaging device that includes at least one pixel. The pixel includes a photodiode, a floating diffusion element in a region of the photodiode and a read out gate electrode at least partially surrounding the floating diffusion element in plan view.

22 Claims, 16 Drawing Sheets

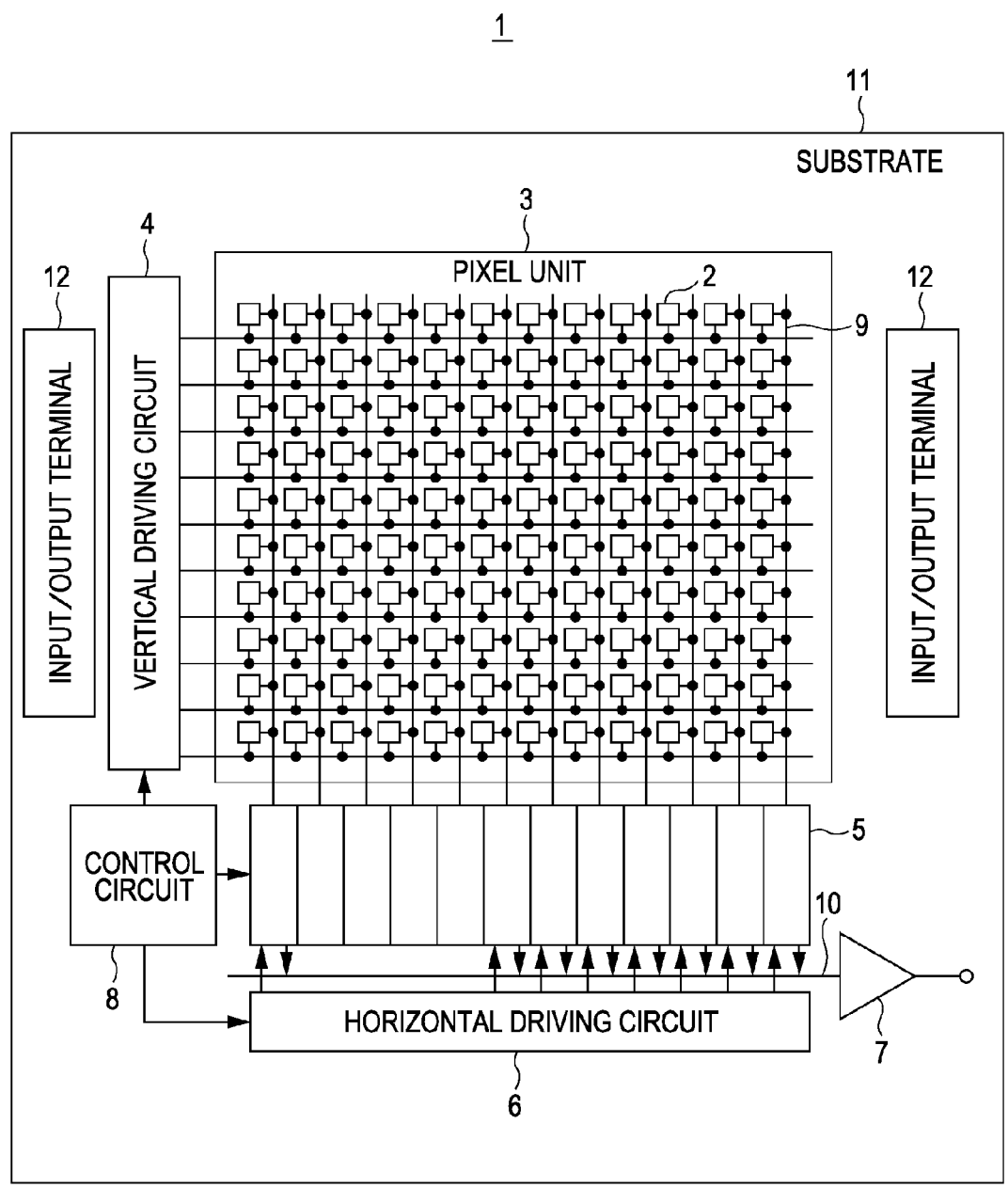

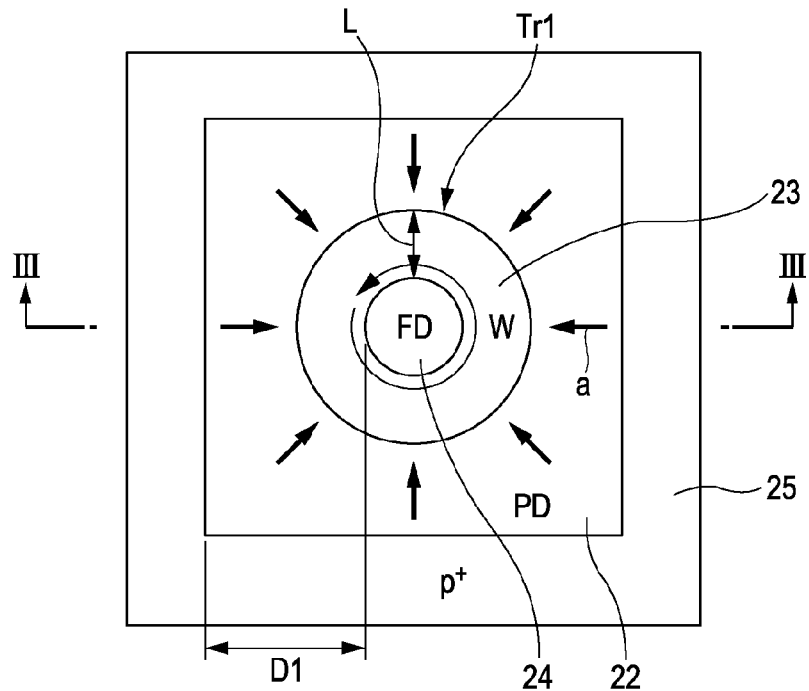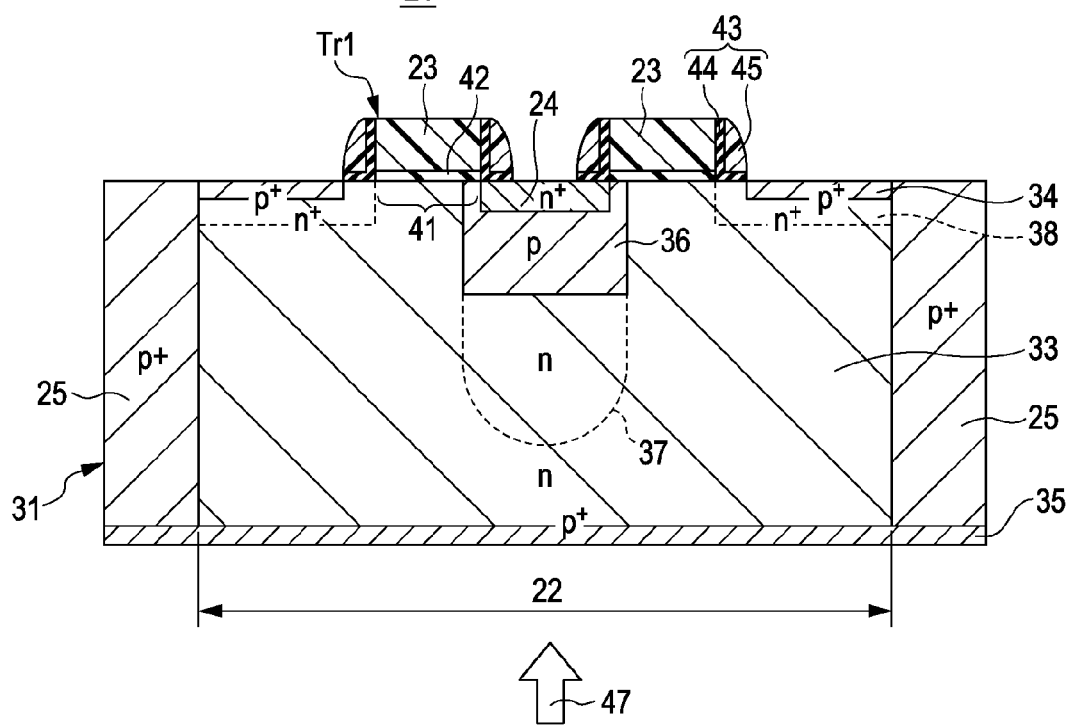

SOLID-STATE IMAGING DEVICE, MANUFACTURING METHOD THEREOF, AND ELECTRONIC APPARATUS

RELATED APPLICATION DATA

The present application claims priority to Japanese Patent Application JP 2009-198119 filed in the Japanese Patent Office on Aug. 28, 2009, the entirety of which is hereby incorporated by reference herein to the extent permitted by law.

BACKGROUND OF THE INVENTION

The present invention relates to solid-state imaging devices, manufacturing methods thereof, and electronic apparatuses such as cameras equipped with these solid-state imaging devices.

As a solid-state imaging device, an amplification-type solid-state imaging device typified by a MOS-type image sensor such as a CMOS (complementary metal oxide semiconductor)-type image sensor is well known. As another solid-state imaging sensor, a charge-transfer-type solid-state imaging device typified by a CCD (charge coupled device) image sensor is also well known. These solid-state imaging devices are widely used in digital cameras, digital video cameras, and the like. In recent years, MOS-type image sensors have been widely used as solid-state imaging devices installed in mobile devices such as camera cellular phones and PDAs (personal digital assistants) because of their low working voltages and low power consumption.

A MOS-type solid-state imaging device (hereinafter referred to as a MOS solid-state imaging device) is a device in that includes a plurality of pixels. Each pixel is composed of a photodiode, which functions as a photoelectric conversion element and at least one pixel transistor. The pixels are arranged in a two-dimensional array. Recently, in order to reduce the area occupied by the pixel transistors in each pixel to miniaturize the pixel, a so-called a component-shared-by-plural-pixels structure in which a single pixel transistor is shared by plural pixels has been proposed. In the component-shared-by-plural pixels structure, because a photodiode provided to each pixel can occupy a larger area, the sensitivity of the photodiode can be improved. For example, solid-state imaging devices with component-shared-by-two-pixels structures are disclosed in Japanese Unexamined Patent Application Publication Nos. 2004-172950, 2006-54276, and 2006-157953. In addition, solid-state imaging devices with component-shared-by-two-by-two-pixels structures are disclosed in Japanese Unexamined Patent Application Publication Nos. 2009-135319.

FIG. 23 is a diagram showing an example of a schematic configuration of a MOS solid-state imaging device with a component-shared-by-two-pixels structure. In this solid-state imaging device 101, photodiodes PD1 and PD2, which function as photoelectric conversion elements, are disposed in such a manner that they face each other with a floating diffusion element (FD) 102 disposed therebetween. A readout gate electrode 103 is formed between the photodiode PD1 and the floating diffusion element 102 through a gate insulating layer. A readout gate electrode 104 is also formed between the photodiode PD2 and the floating diffusion element 102 through a gate insulating layer. A transistor Tr11 is composed of the readout gate electrodes 103 and the floating diffusion element 102, and a transistor Tr12 is composed of the gate electrode 104, and the floating diffusion element 102. The transistors Tr11 and Tr12 are respectively connected to the photodiodes PD1 and PD2. One sharing unit is defined as a combination of these two pixels including the photodiodes PD1 and PD2, and plural sharing units are arranged in a two-dimensional array. A reset transistor Tr2, an amplifying transistor Tr3, and a selection transistor Tr3 are prepared for each sharing unit.

The reset transistor Tr2 is composed of a pair of source/drain regions 105 and 106, and a reset gate electrode 109. The amplifying transistor Tr3 is composed of a pair of source/drain regions 106 and 107, and an amplifying gate electrode 110. The selection transistor Tr4 is composed of a pair of source/drain regions 107 and 108, and a selection gate electrode 111. These readout transistors Tr11 and Tr12, the reset transistor Tr2, the amplifying transistor Tr3, and the selection transistor Tr4 are so-called pixel transistors.

Although not shown in FIG. 23, the floating diffusion element 102 is connected to the amplifying gate electrode 110 and one source/drain region 105 of the reset transistor Tr2. The other source/drain region 106 is connected to a power supply VDD. In addition, one source/drain region 108 of the selection transistor Tr4 is connected to a vertical signal line, On the other hand, a back-illuminated type solid-state imaging device having a light-receiving surface on the back side of a substrate that is opposite to the surface of the substrate on which multilayer interconnections, pixel transistors, and the like are formed, is disclosed in Japanese Unexamined Patent Application Publication Nos. 2003-31785.

SUMMARY OF THE INVENTION

In the related art, a floating diffusion element and a readout transistor including a readout gate electrode are generally formed next to the end of a photodiode in a MOS solid-state imaging device (See FIG. 23 as an example). In an MOS solid-state imaging device having such a structure, when signal charge in a photodiode is read out to be transferred to a floating diffusion element, it is difficult to read out some of the signal charge located in portions of the photodiode that are far from the readout gate electrode, and there is a possibility that some of the signal charge will be left without being read out. In other words, there is a possibility of residual images being generated owing to a so-called readout distance $D_0$. Therefore, in the related art, in order that none of the signal charge is left without being read out, a readout gate voltage is set to be high, with the result that the effect of potential modulation can reach far and wide and the entirety of the signal charge can be read out. Alternatively, the amount of saturated signal charge Qs is set to be small so that the signal charge can be easily read out. For example, if an implanted n-type impurity concentration in the n-type charge storage region of a photodiode is set to be low, the amount of saturated signal charge Qs can be set to be small.

For example, it is necessary that a solid-state imaging device with large-sized pixels such as a single-lens reflex camera has a high readout gate voltage in order to avoid the danger of some parts of signal charge being left alone without being read out, which typically leads to a high power supply voltage.

The present invention is achieved with the above-described problems in mind. Embodiments of the invention provide a solid-state imaging device that has short readout distances and the capability of reducing the generation of residual images, a manufacturing method thereof, and an electronic apparatus equipped with this solid-state imaging device.

According to an embodiment of the present invention, there is a solid-state imaging device, which includes at least one pixel. The pixel includes a photodiode, a floating diffusion element in a region of the photodiode, and a read out gate electrode that at least partially surrounds the floating diffusion element in plan view.

In the solid-state imaging device according to an embodiment of the present invention, the read out gate electrode completely surrounds the floating diffusion region in plan view.

In the solid-state imaging device according to an embodiment of the present invention, the read out gate electrode effectively surrounds the floating diffusion region in plan view.

In the solid-state imaging device according to an embodiment of the present invention, the read out gate electrode completely surrounds the floating diffusion region in plan view.

In the solid-state imaging device according to an embodiment of the present invention, the read out gate electrode has a ring shape in plan view. According to this embodiment, the ring shape can be uniform in width throughout. Furthermore, according to this embodiment, a portion of the ring shape can be missing.

In the solid-state imaging device according to an embodiment of the present invention, the read out gate electrode has a quadrangular shape in plan view. According to this embodiment, the read out gate electrode can also have a rectangular shape in plan view. Furthermore, according to this embodiment, each corner of the quadrangular shape can have a rounded edge in plan view.

In the solid-state imaging device according to an embodiment of the present invention, the read out gate electrode is in a central region of the photodiode.

According to another embodiment of the invention, the floating diffusion element is at an optical center of the photodiode.

In the solid-state imaging device according to an embodiment of the present invention, a p-type semiconductor well region is below the surface of a central region of the photodiode and another p-type semiconductor region below the surface of the photodiode. In this embodiment, a connection region is under a portion of the read out gate electrode so as to connect the p-type semiconductor well region to the another p-type semiconductor region.

According to an embodiment of the invention, a semiconductor well region is below the surface of the photodiode so as to be surrounded by the photodiode.

According to an embodiment of the invention, the solid-state imaging device is a back-illuminated device in which incident light enters from a surface of the photodiode that is facing away from the read out gate electrode.

According to an embodiment of the invention, the photodiode is an n-type semiconductor and a p-type semiconductor well region is located below a central region of the photodiode. In this embodiment, the p-type semiconductor well region is surrounded by the n-type semiconductor region.

According to an embodiment of the invention, the floating diffusion region is surrounded by the p-type semiconductor well.

According to an embodiment of the invention, the solid-state imaging device includes a separating region on each side of the photodiode. In this embodiment, additional transistors are within one or both of the separating regions.

According to an embodiment of the invention, the solid state imaging device includes a pixel section composed of a plurality of sharing units. In this embodiment, each sharing unit comprises a first component section having a plurality of pixels and a second component section having a plurality of pixels. Furthermore, in this embodiment an amplifying transistor is disposed between the first and second component sections.

This configuration causes a readout distance from the peripheral edge of the photodiode to the floating diffusion element to be shortened. In addition, when signal charge in the photodiode is read out, the signal charge is read out from the periphery of the readout gate electrode to the floating diffusion element.

A method for manufacturing the solid-state imaging device according to the embodiment of the present invention includes the steps manufacturing a pixel. According to this embodiment, the steps of forming a floating diffusion region within the photodiode and forming a read out gate electrode around the floating diffusion region such that the read out gate electrode at least partially surrounds the floating diffusion region in plan view are included in the manufacturing of the solid-state imaging device.

According to another embodiment of the invention, the photodiode is an n-type semiconductor and the method of manufacturing the pixel further includes the step of ion-implanting a p-type impurity into a part of the surface of the n-type semiconductor photodiode surrounded by the read out gate electrode via self-alignment by using the read out gate electrode as a mask.

In the method for manufacturing the solid-state imaging device according to the embodiment of the present invention, the semiconductor well region and the floating diffusion element in the region of the photodiode are formed by self-alignment with the use of the readout gate electrode as a mask.

An electronic apparatus according to the embodiment of the present invention includes a photodiode, a floating diffusion element in a region of the photodiode, and a read out gate electrode at least partially surrounding the floating diffusion element in plan view. Furthermore, according to this embodiment, the electronic apparatus can have an imaging function.

Because the electronic apparatus according to the embodiment of the present invention is equipped with the above-described solid-state imaging device, signal charge stored in the photodiode embedded in the solid-state imaging device can be easily read out and transferred to the floating diffusion element.

The solid-state imaging device according to the embodiment of the present invention causes the readout distance from the peripheral edge of the photodiode to the corresponding floating diffusion element to be shortened, with the result that the signal charge can be easily read out and the generation of residual images can be reduced.

In the method for manufacturing the solid-state imaging device according to the embodiment of the present invention, because the semiconductor well regions and the floating diffusion elements can be formed by self-alignment, a solid-state imaging device with capability to easily read out the above-described signal charge can be manufactured with a high degree of accuracy.

In the electronic apparatus according to the embodiment of the present invention, the signal charge stored in the photodiodes embedded in the solid-state imaging device can be easily read out, the generation of the residual images can be reduced, and the quality of the images can be improved. Therefore, the electronic apparatus with high quality can be provided.

BRIEF DESCRIPTION OF THE DRAWINGS

FIG. 1 is a schematic configuration diagram showing an example of a MOS solid-state imaging device;

FIG. 2 is a schematic configuration diagram showing the main portion of a solid-state imaging device;

FIG. 3 is a cross-sectional view taken along the line III-III of FIG. 2;

DESCRIPTION OF THE PREFERRED EMBODIMENTS

Figure 4:
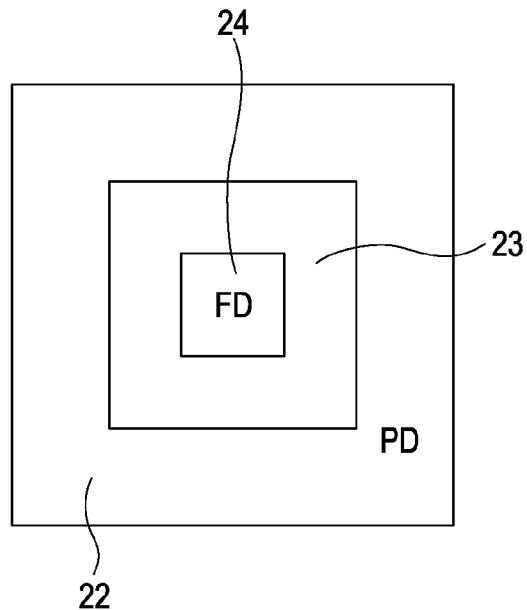
FIG. 4 is a schematic plan view showing another example of a pattern of a photodiode and a readout gate electrode.

Embodiments according to the present invention will be described in detail hereinafter.

FIG. 1 is a schematic configuration diagram showing an example of a MOS solid-state imaging device that is applied to various embodiments of the present invention. The solid-state imaging device 1 of this example includes a pixel section (an imaging region) 3 in which plural pixels 2 having plural photodiodes, which function as photoelectric conversion elements, are regularly arranged in a two-dimensional array on a semiconductor substrate 11 and a peripheral circuit section. The semiconductor substrate 11 can be a silicon substrate. A pixel 2 is composed of a photodiode and plurality pixel transistors (MOS transistors). The plurality pixel transistors are, for example, a readout transistor, a reset transistor, and an amplifying transistor. The pixel transistors can also include a selection transistor. The pixel section 3 can be composed of plural unit pixels, each of which is a combination of a photodiode and plural pixel transistors, arranged in a two-dimensional array. The pixel section 3 can be also composed of a plurality of the above-described component-shared-by-plural-pixels structures arranged in a two-dimensional array with the use of a component-shared-by-plural-pixels structure as a structural unit.

The peripheral circuit section is composed of a vertical driving circuit 4, column signal processing circuits 5, a horizontal driving circuit 6, an output circuit 7, a control circuit 8, and the like. The control circuit 8 receives an input clock, data that indicates operation modes, and the like, and outputs data regarding internal information of the solid-state imaging device, and the like. In other words, the control circuit 8 generates clock signals and control signals, on the basis of which the vertical driving circuit 4, the column signal processing circuits 5, the horizontal driving circuit 6, and the like operate, with the use of a vertical synchronous signal, a horizontal synchronous signal, and a master clock. Next, the control circuit 8 sends these signals to the vertical driving circuit 4, the column signal processing circuits 5, the horizontal driving circuit 6, and the like.

The vertical driving circuit 4 is composed of, for example, shift registers, and selects a pixel driving line, and sends a pulse for driving pixels on a pixel row-by-pixel row basis to the selected pixel driving line. In other words, the vertical driving circuit 4 scans pixels 2 of the pixel section 3 on a pixel row-by-pixel row basis, and feeds a pixel signal corresponding to signal charge generated on the basis of the amount of light received by a photoelectric conversion element (for example, a photodiode) belonging to each pixel 2, to the corresponding column signal processing circuits 5 through the corresponding vertical signal line 9.

One column signal processing circuit 5 is assigned to, for example, each pixel column of the pixel section 3, and the column signal processing circuit 5 performs various types of signal processing on signals output from pixels 2 belonging to the currently scanned pixel row on a pixel column-by-pixel column basis. The various types of signal processing performed on the signals includes, for example, noise elimination. In other words, the column signal processing circuit 5 performs various types of signal processing such as CDS processing for eliminating fixed pattern noise unique to the pixels 2, signal amplification, A/D conversion, and the like. A horizontal selection switch (not shown) is installed between the output stage of each column signal processing circuit 5 and a horizontal signal line 10.

The horizontal driving circuit 6 is composed of, for example, shift registers, and sequentially selects the column signal processing circuits 5 by sequentially sending out horizontal scanning pulses, and causes each column signal processing circuit 5 to output a pixel signal to the horizontal signal line 10.

The output circuit 7 performs signal processing on signals that are sequentially fed through the horizontal signal line 10 by the column signal processing circuits 5, and sends out the processed signals. In some cases, the output circuit 7 only functions as a buffer toward the signals, and in other cases, the output circuit 7 performs black level adjustment, column variation correction, various types of digital signal processing, and the like on the signals. An input/output terminal 12 sends or receives signals to/from the external.

If the above-described solid-state imaging device 1 is a front-illuminated type solid-state imaging device, a multilayer interconnection layer that has plural layer interconnections through an interlayer insulating layer is formed on the surface of the substrate on which the pixel section 3 and the peripheral circuit section have been formed. In the pixel section 3, an on-chip color filter is formed on the multilayer interconnection layer through a planarizing film, and furthermore an on-chip microlens is formed on the on-chip color filter.

If the above-described solid-state imaging device 1 is a back-illuminated type solid-state imaging device, the multilayer interconnection layer is not formed on the back side of a substrate where a light entrance surface (a so-called light-receiving surface) is located. The multilayer interconnection layer is formed on the surface of the substrate that is opposite to the light-receiving surface. The on-chip color filter is formed on the back side of the substrate, on which the light-receiving surface is located, through an insulating layer, and furthermore the on-chip microlens is formed on the on-chip color filter.

A First Embodiment of the Present Invention

FIG. 2 and FIG. 3 are diagrams showing a solid-state imaging device according to a first embodiment of the present invention, that is, a MOS solid-state imaging device. FIG. 2 is a diagram showing a fundamental schematic planar structure (layout) of a pixel composed of a photodiode, a floating diffusion element, and a readout transistor. FIG. 3 is a cross-sectional view of the schematic structure of the pixel taken along the line III-III of FIG. 2. This embodiment is an example of a back-illuminated-type solid-state imaging device to which the present invention is applied.

As shown in FIG. 2, a solid-state imaging device 21 according to the first embodiment includes pixels, each of which includes a photodiode (PD) 22, a readout gate electrode 23 of a readout transistor Tr1 and a floating diffusion element (FD) 24 disposed in the region of the photodiode (PD) 22. The floating diffusion element 24 is formed in the region surrounded by the readout gate electrode 23. In other words, when viewing the planar layout of the pixel, the readout gate electrode 23 is formed so as to surround the floating diffusion element 24, and the photodiode 22 is formed so as to surround the readout gate electrode 23. An element separating region 25, which is composed of a p-type semiconductor in this embodiment, is formed so as to surround the photodiode 22.

Although not shown in FIG. 2, the pixel transistors other than the readout transistor Tr1 are formed outside the photodiode 22. The pixel section is composed of plural photodiodes, each of which includes a readout gate electrode 23 and a floating diffusion element 24, arranged in a two-dimensional array.

It is preferable that the readout gate electrode 23 is formed in a ring-like shape of uniform width so as to surround the floating diffusion element 24. Furthermore, it is preferable that the readout gate electrode 23 is formed in a circular ring-like shape of uniform width (which is a so-called gate length) L as shown in FIG. 2. It is preferable that the readout gate electrode 23 is formed in the central region of the photodiode 22 and the floating diffusion element 24 is formed so as to be located at the optical center of the photodiode 22. By disposing the readout gate electrode 23 in the central region of the photodiode 22, a readout distance D1 from any peripheral edge point of the photodiode 22 to the peripheral edge of the floating diffusion element 24 can be shortened. In the case where the readout gate electrode 23 is formed in the central region of the photodiode 22, even if the region of the photodiode 22 is square-shaped, the readout distance D1 from any peripheral edge point of the photodiode 22 to the peripheral edge of the floating diffusion element 24 is approximately uniform.

In this embodiment, as shown in the cross-sectional structure of the pixel in FIG. 3, a semiconductor well region is formed below the surface of the photodiode 22 so as to be surrounded by the photodiode 22, and the floating diffusion element 24 is formed so as to be surrounded by this semiconductor well region. In addition, this solid-state imaging device 21 is a back-illuminated-type solid-state imaging device in which incident light enters from the back side of the substrate that is opposite to the surface of the substrate on which the readout gate electrode 23 is formed. Therefore, an area occupied by the photodiode 22 is the entire area under a region in which both the readout gate electrode 23 and the floating diffusion element 24 are disposed, that is, an area under a region that the readout transistor Tr1 occupies.

The cross-sectional structure shown in FIG. 3 will be described hereinafter. In this embodiment, the element separating region 25 is formed in a first conductivity type region. In this embodiment, a region of an n-type semiconductor substrate 31 where the pixel section will be formed is the first conductivity type region, however, the first conductivity type region can also be a p-type semiconductor substrate. Additionally, a region of a photodiode 22 is assigned for each pixel. The element separating region 25 is formed of a second conductivity type region. In this embodiment, a p-type semiconductor region extends in the depth direction from the surface to the back side of the semiconductor substrate 31, however, the second conductivity type region can also be an n-type semiconductor substrate.

Moreover, in other embodiments of the invention where the region is an n-type region, the region can also be a p-type region. Similarly, in other embodiments of the invention where the region is p-type region, the region can also be an n-type region. As such, in the embodiments of this invention it is possible that a semiconductor region can be an n-type region or p-type region.

The photodiode 22 is formed of an n-type semiconductor region 33 of the semiconductor substrate 31 surrounded by the element separating region 25 and a p-type semiconductor region 34 of high-impurity concentration formed below the surface of the substrate. A p-type semiconductor region of high-impurity concentration 35 is also formed on the back side of the substrate. These p-type semiconductor regions 34 and 35 also suppress the occurrence of dark currents that are generated at the border of the insulating layer.

A p-type semiconductor well region 36 is formed under the central region of the surface of the photodiode 22 so as to be surrounded by the n-type semiconductor region 33. Furthermore, the floating diffusion element 24 is formed under the center of the surface of the p-type semiconductor well region 36 so as to be surrounded by the p-type semiconductor well region 36.

Formed under the p-type semiconductor well region 36 is an n-type region 37, the concentration of which is lower than that of the n-type semiconductor region 33 owing to the effect of impurity diffusion occurring in the nearby p-type semiconductor well region 36. A charge storage region 38 of the photodiode 22 is formed under the surface of the substrate. The charge storage region 38 is formed of an n-type region, the concentration of which is higher than that of the n-type semiconductor region 33.

A surface side portion of the p-type semiconductor well region 36 and a surface side portion of the n-type semiconductor region 33, both of which are located between the n-type charge storage region 38 and the floating diffusion element 24, function as a channel region 41 of the readout gate. The readout gate electrode 23 is formed of p-type or n-type polysilicon on this channel region 41 through a gate insulating layer 42 so as to surround the floating diffusion element 24. Formed on the side of the readout gate electrode 23 is a sidewall 43. The sidewall can be formed of an insulating layer 44 and a p-type or n-type polysilicon film 45 thereon. The sidewall 43 can be formed of the insulating layer only on the side of the floating diffusion element 24, or can be formed both on the side of the floating diffusion element 24 and on the side of the photodiode 22. The readout transistor Tr1 is composed of the n-type charge storage region 38 of the photodiode 22, which functions as a source region, the n-type floating diffusion element 24, which functions as a drain region, and the readout gate electrode 23.

A region that constitutes the photodiode 22 is the entirety of an area surrounded by the element separating region 25 formed of the p-type semiconductor region including a region under the p-type semiconductor well region 36 that surrounds the floating diffusion element 24. In this embodiment, although the photodiode 22 is a main part of the photoelectric conversion element, the floating diffusion element 24 and the p-type semiconductor well region 36 also function as photoelectric conversion regions.

Although not shown in FIG. 3, the pixel transistors other than the readout transistor Tr1 are formed in the p-type semiconductor well region outside the photodiode 22. Furthermore, a multilayer interconnection layer that has plural interconnections is formed through an interlayer insulating layer on the surface of the substrate on which the pixel section 3 and the peripheral circuit section have been formed. In addition, a supporting substrate composed of, for example, silicon is bonded to the top of this multilayer interconnection layer. The on-chip color filter and the on-chip microlens are built up in this order on the back side of the substrate, on which the light entrance surface has been positioned, through an insulating layer.

Next, the behavior of the solid-state imaging device 21 according to the first embodiment will be described. In the charge storage period of the pixel, light 47 that enters from the back side of the substrate is photoelectrically converted into signal charge (the charge is composed of electrons in this embodiment) in the region of the photodiode 22, and this signal charge is stored in the n-type charge storage region 38. The photodiode 22 formed in the whole region surrounded by the element separating region 25 including the region under the p-type semiconductor well region 36 causes the amount of saturated signal charge Qs to be large. Furthermore, the p-type semiconductor well region 36 and the floating diffusion element 24 that function as the photoelectric conversion regions causes the amount of saturated signal charge Qs to grow larger.

In the charge storage period, a negative bias voltage can be applied to the readout gate electrode 23. When the negative bias voltage is applied, the surface portion of the charge storage region 38 under the readout gate electrode 23 and under the sidewall 43 composed of n-type or p-type polysilicon is put in a hole pinning state. Therefore, because the sidewall 45 composed of polysilicon is capacitively coupled with the readout gate electrode 23, the negative bias voltage is also applied to the sidewall 45. Owing to this hole pinning state, the occurrence of dark currents that are generated at the border between the charge storage region 38 and the insulating layer is suppressed and the occurrence of white spots is also suppressed.

On the other hand, a ground potential is applied to the p-type semiconductor region 34 on the surface portion of the photodiode 22 through a substrate contact. The substrate contact is a contact that is mounted to apply the ground potential to the p-type semiconductor well region in which the pixel transistors other than the readout transistor are formed in order that the potential of this p-type semiconductor well region may be kept stable. Owing to the negative bias voltage, the surface portion of the charge storage region 38 is put in a pinning state, and becomes a p-type semiconductor. Therefore, the ground potential is applied to the p-type semiconductor well region 36 through the p-type semiconductor region 34 and the surface portion in the hole spinning state, with the result that the potential of the p-type semiconductor well region 36 is fixed.

Next, in the signal readout period, a positive voltage, that is, a readout voltage, is applied to the readout gate electrode 23, and the signal charge stored in the charge storage region 38 of the photodiode 22 is read out to be transferred to the floating diffusion element 24. In this signal readout period, the signal charge is read out to be transferred to the floating diffusion element 24 from a surrounding region that surrounds the floating diffusion element 24 as shown by arrows in FIG. 2. Compared with a related pixel structure in which a floating diffusion element is disposed in an edge region of the photodiode, the readout distances D1 from the peripheral edge of the photodiode 22 to the floating diffusion element 24 can be more shortened. Furthermore, because the signal charge is read out from the surrounding region that surrounds the floating diffusion element 24, the entirety of the signal charge stored in the photodiode can be easily read out. In other words, the entirety of the signal charge can be read out without any of the signal charge being left.

In addition, because the readout distance D1 is shortened and the effect of potential modulation easily reaches the periphery of the photodiode 22, the readout voltage can be set to be low.

In the solid-state imaging device 21 according to the first embodiment, because the floating diffusion element 24 is disposed so as to be surrounded by the photodiode 22, the readout distance D1 from the peripheral edge of the photodiode 22 to the floating diffusion element 24 is shortened. Because the readout distance D1 is shortened, the signal charge can be easily read out, and the generation of residual images can be reduced. In addition, because the readout gate electrode 23 is formed in a ring-like shape, the gate width W can be set to be large, and the signal charge can be more easily read out.

Because the signal charge can be easily read out, even if the area occupied by the photodiode is the same in both cases of this embodiment and the related art, a potential well used for storing the charge of the photodiode can be set to be deeper and the amount of saturation signal charge Qs can be larger in the case of this embodiment.

With reference to the cross-sectional view of the pixel, the floating diffusion element 24 is surrounded by the p-type semiconductor well region 36, and the p-type semiconductor well region 36 is surrounded by the photodiode 22. In other words, because the p-type semiconductor well region 36 and the floating diffusion element 24 are formed on the surface portion of the photodiode 22 and this imaging device is of a back-illuminated-type, a region used for photoelectric conversion can be set to be wide and the amount of saturation signal charge Qs can be increased. Therefore, the sensitivity of the solid-state imaging device can be increased.

Furthermore, because the p-type semiconductor well region 36 and the floating diffusion element 24 also function as the photoelectric conversion regions, the amount of saturated signal charge Qs can be set to be larger. Because the signal charge can be easily read out to be transferred to the floating diffusion element 24, the readout gate voltage can be set to be low. Therefore, the power supply voltage can be set to be low, with the result that power consumption can be reduced.

Various shapes of readout gate electrodes can be thought of. For example, as shown in FIG. 4, a readout gate electrode 23 can be formed in a quadrangular shape, which is analogous to the shape of a photodiode 22 when viewed from above. The readout gate electrode can also have a rectangular shape.

Figure 5:
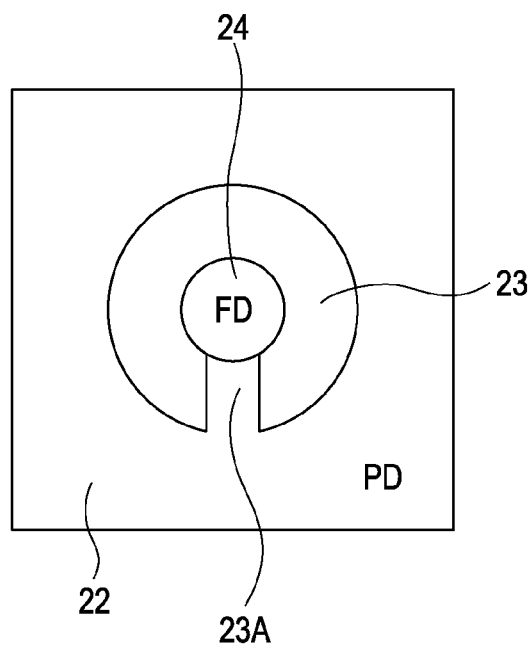
FIG. 5 is a schematic plan view showing another example of a pattern of a photodiode and a readout gate electrode.

As another example, a readout gate electrode 23 can be formed in a circular ring-like shape with a part of the ring shape missing. Additionally, the read out gate electrode can surround almost all of the parts of the periphery of a floating diffusion element 24, as shown in FIG. 5, when viewed from above. In this case, a surface portion of the substrate under an absent part 23A of the readout gate electrode 23 is filled with a portion extending from a p-type semiconductor region 34 of a photodiode 22.

The various shapes of the read out gate electrode can surround the floating diffusion element 24 in varying amounts. For example, the read out gate electrode can completely surround the floating diffusion element 24, partially surround the floating diffusion element 24 or effectively surround the floating diffusion element 24. As such, surround does not mean that the gate electrode surrounds the entire floating diffusion element because the gate electrode can surround all or part of the floating diffusion element.

Figure 6:
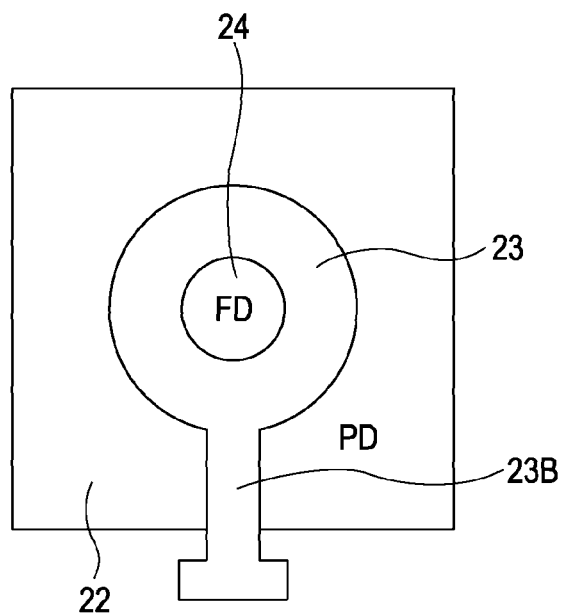
FIG. 6 is a schematic plan view showing another example of a pattern of a photodiode and a readout gate electrode.

As another example, a readout gate electrode 23 can be formed in a circular ring-like shape with a part of the shape extending to the outside of a photodiode 22, while surrounding a floating diffusion element 24, as shown in FIG. 6 when viewed from the top. An extension portion 23B of the readout gate electrode 23 allows the readout gate electrode 23 to be easily connected to an interconnection of the multilayer interconnection layer. In this case, the p-type semiconductor region 34 of the photodiode 22 can be formed so as to extend to under the extension portion 23B.

Figure 7:
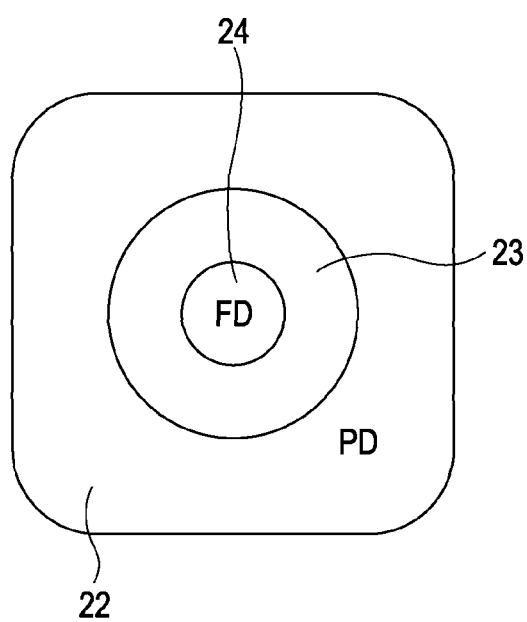
FIG. 7 is a schematic plan view showing another example of a pattern of a photodiode and a readout gate electrode.

Another example of the shape of a photodiode 22 is shown in FIG. 7. The photodiode 22 is formed in a square-like shape with its four corners having a rounded shape when viewed from above. Formed on the central region of the photodiode 22 is a read gate electrode 23 of a circular ring-like shape surrounding a floating diffusion element 24. In the case where the photodiode 22 is formed in the square-like shape with four rounded corners, a readout distance D1 from any peripheral edge point of the photodiode 22 to the floating diffusion element 24 is more uniform than in other cases, with the result that signal charge can be more easily read out as a whole.

Furthermore, a floating diffusion element 24 and a readout gate electrode 23 can be formed a little apart from the central region of the photodiode 22. Also in this case, compared with the structures of pixels according to the related art, a readout distance is more shortened, and signal charge can be more easily read out to be transferred to the floating diffusion element 24.

Figure 8:
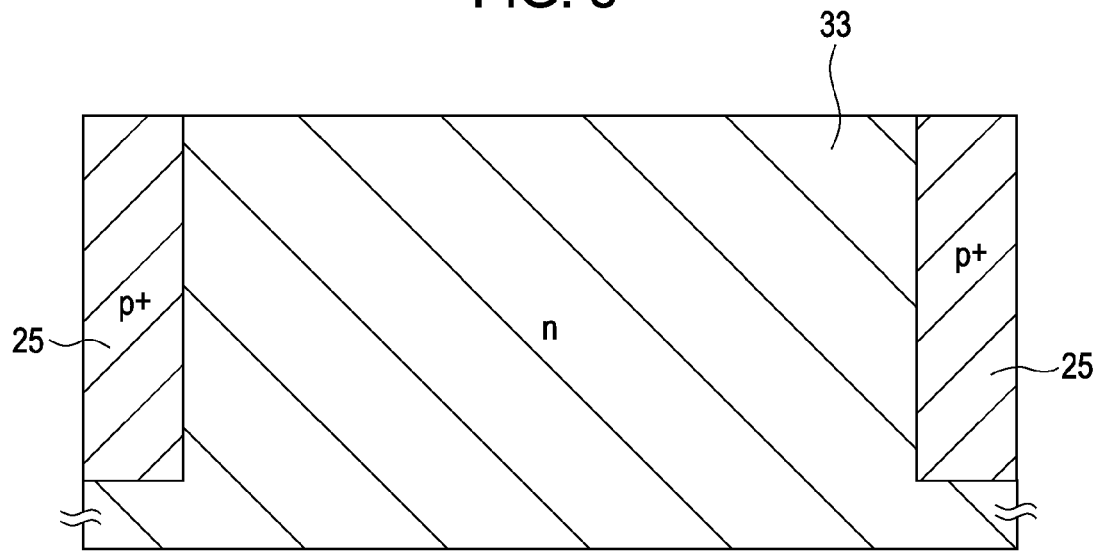
FIG. 8 is a manufacturing process diagram showing an example of a method for manufacturing the solid-state imaging device.

FIG. 8 to FIG. 17 show an example of the method for manufacturing the solid-state imaging device 21 according to the first embodiment. As shown in FIG. 8, an n-type semiconductor substrate 31 is prepared, and then an element separating region 25 composed of a p-type semiconductor region is formed in this n-type semiconductor substrate 31 by selective ion-implantation. The element separating region 25 is formed a predetermined depth into the substrate 31. In a pixel section, each element separating region 25 is formed so as to surround a photodiode that constitutes part of a pixel and the pixel including pixel transistors. FIG. 8 is a diagram showing the element separating region 25 that surrounds the region of the photodiode.

Figure 9:
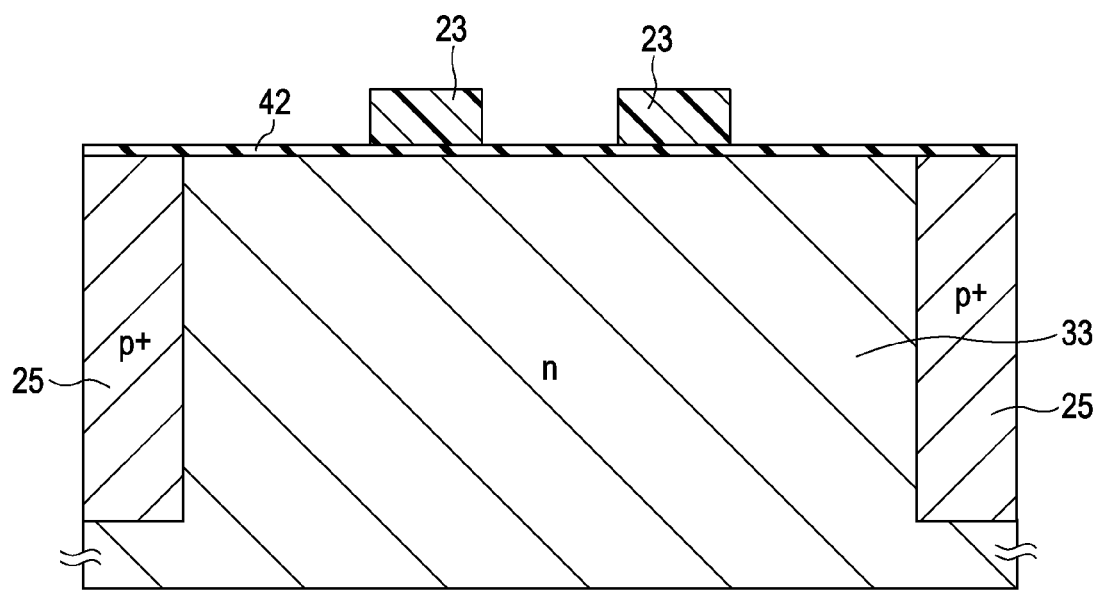
FIG. 9 is a manufacturing process diagram showing an example of a method for manufacturing the solid-state imaging device.

Next, as shown in FIG. 9, a readout gate electrode 23 is formed on the surface of the semiconductor substrate 31 with a gate insulating layer 42 (for example, a silicon dioxide film) therebetween. The readout gate electrode 23 is formed in a ring-like shape (in a circular ring-like shape in this example) on the central region of the photodiode region surrounded by the element separating region 25. The readout gate electrode 23 is formed of p-type or n-type polysilicon.

Figure 10:
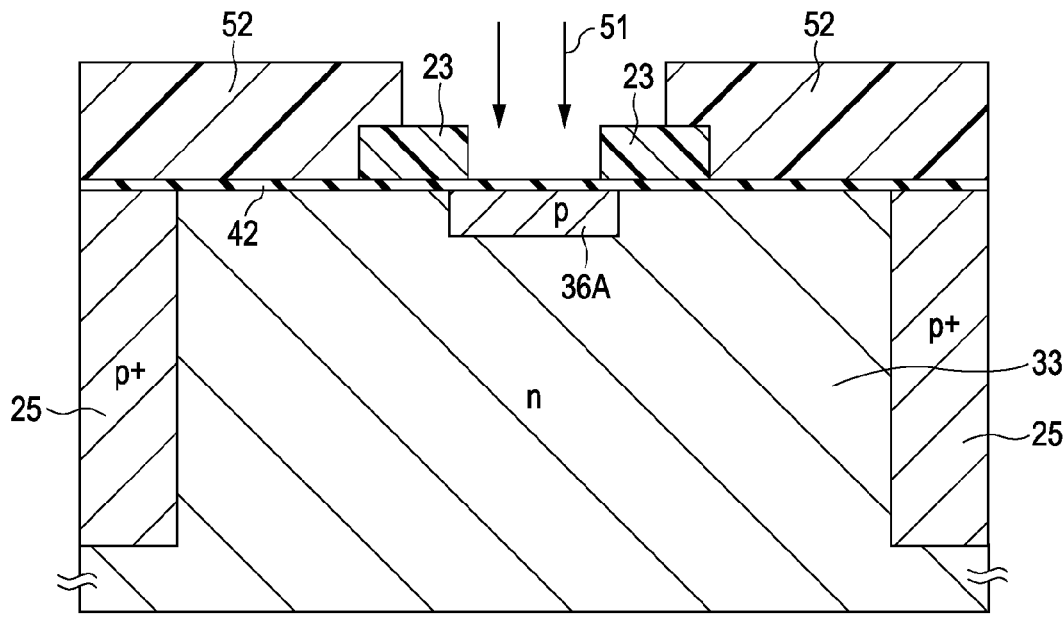
FIG. 10 is a manufacturing process diagram showing an example of a method for manufacturing the solid-state imaging device.

Next, as shown in FIG. 10, a p-type ion-implanted region 36A is formed by ion-implanting a p-type impurity 51 into a part of the surface of the substrate surrounded by the readout gate electrode 23 of circular ring-like shape by self-alignment with the use of the readout gate electrode 23 as a mask. The ion-implantation of the p-type impurity 51 can be achieved by, for example, boron(B) implantation. It is necessary to form a photo-resist mask 52 that covers the surface of the substrate outside the readout gate electrode 23 and also covers the outer circular ring-like part of the readout gate electrode 23 before this ion-implantation.

Figure 11:
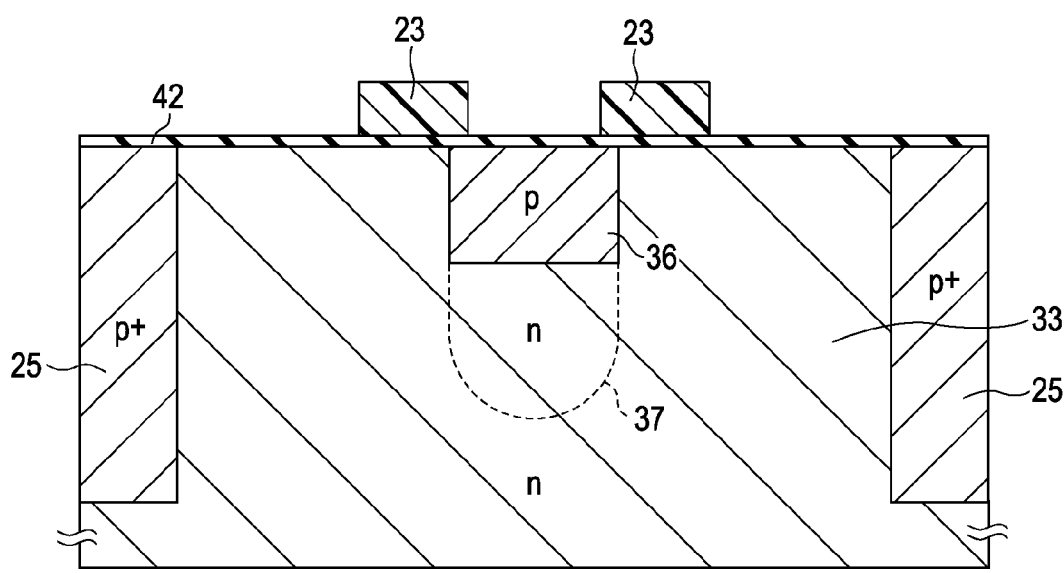
FIG. 11 is a manufacturing process diagram showing an example of a method for manufacturing the solid-state imaging device.

Next, as shown in FIG. 11, a p-type semiconductor well region 36 is formed so as to extend downward into the readout gate electrode 23 by causing the p-type ion-implanted region 36A to diffuse by heat treatment. This heat treatment causes an n-type region 37, the concentration of which is lower than that of the substrate, to be formed under the p-type semiconductor well region 36.

Figure 12:
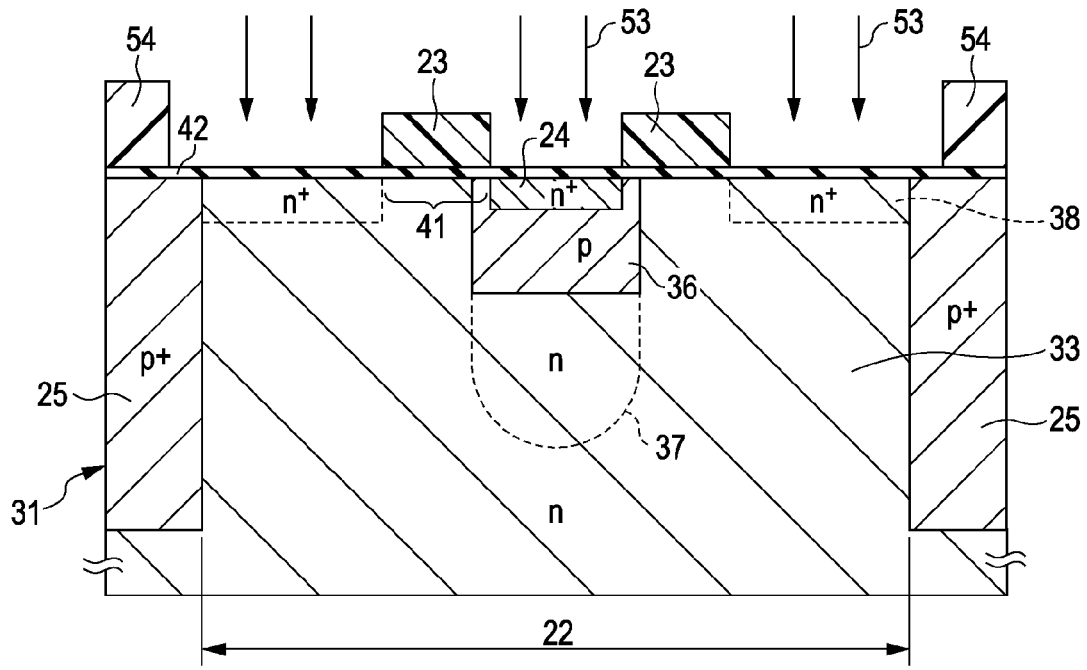
FIG. 12 is a manufacturing process diagram showing an example of a method for manufacturing the solid-state imaging device.

Next, as shown in FIG. 12, an n-type floating diffusion element 24 is formed by ion-implanting an n-type impurity 53 into a part of the surface of the p-type semiconductor well region 36 surrounded by the readout gate electrode 23 of circular ring-like shape by self-alignment with the use of the readout gate electrode 23 as a mask. In other words, the floating diffusion element 24 according to this example is formed at the optical center of the region of the photodiode. At the same time, an n-type charge storage region 38 is formed in the surface portion of the n-type substrate located outside the readout gate electrode 23. The ion-implantation of the n-type impurity 53 can be achieved by, for example, arsenic (As) implantation. It is necessary to form a photo-resist mask 54 that covers the element separating region 25 formed of the p-type semiconductor region before this ion-implantation. A channel region 41 is formed under the readout gate electrode 23.

Figure 13:
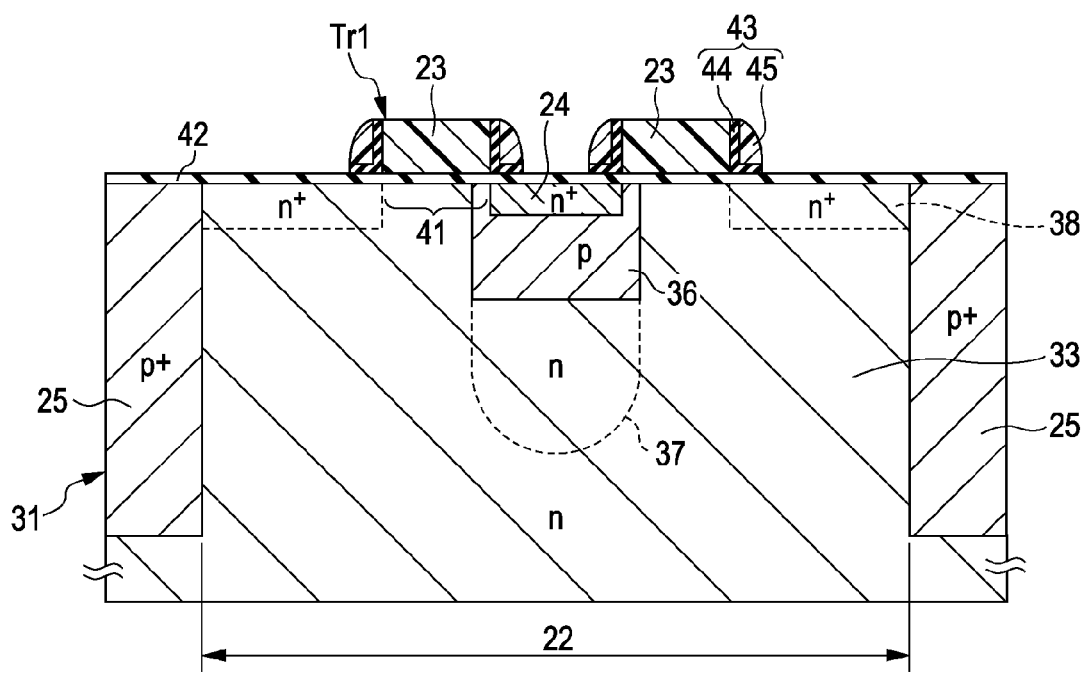
FIG. 13 is a manufacturing process diagram showing an example of a method for manufacturing the solid-state imaging device.

Next, as shown in FIG. 13, a sidewall 43 is formed at the side of the readout gate electrode 23. The sidewall 43 can be formed of an insulating layer 44 and n-type polysilicon 45.

Figure 14:
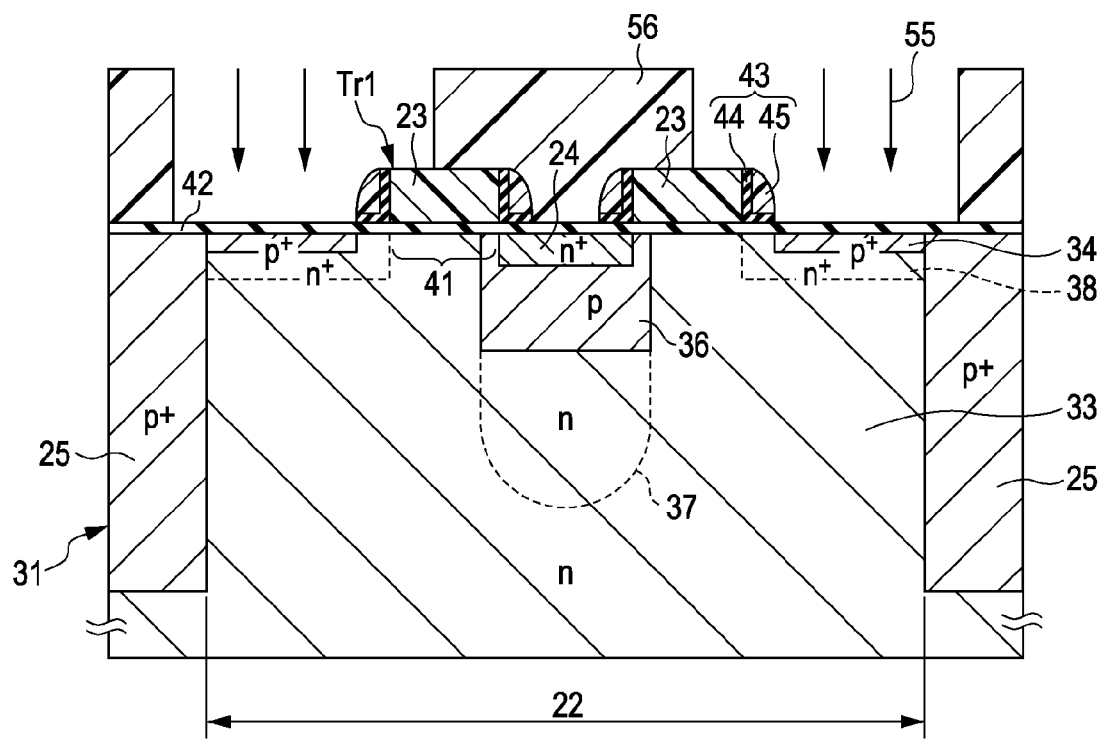
FIG. 14 is a manufacturing process diagram showing an example of a method for manufacturing the solid-state imaging device.

Next, as shown in FIG. 14, a p-type semiconductor region 34 is formed by ion-implanting a p-type impurity 55 into the surface of the n-type substrate by self-alignment with the use of the readout gate electrode 23 and the side wall 43 as masks. As a result, a photodiode 22 is formed of an n-type region 33 and the p-type semiconductor region 34, both of which are surrounded by the element separating region 25. The ion-implantation of the p-type impurity 55 can be achieved by, for example, boron(B) implantation. It is necessary to form photo-resist masks 56 so that one of the photo-resist masks covers the floating diffusion element 24 and the inner circular ring-like part of the readout gate electrode 23 and the other covers the outer circular ring-like part of the surface of the element separating region 25 before this ion-implantation.

Figure 15:
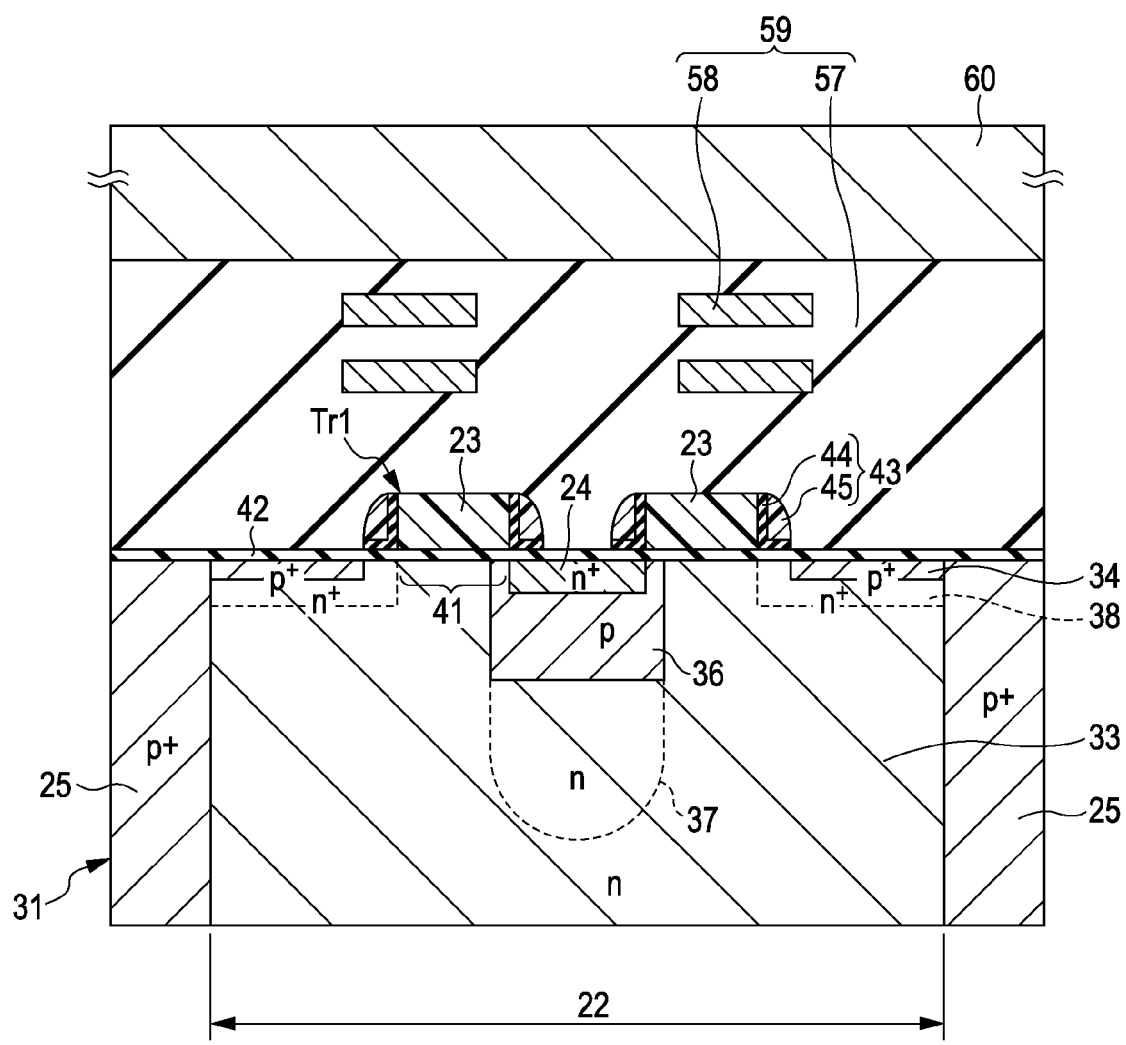
FIG. 15 is a manufacturing process diagram showing an example of a method for manufacturing the solid-state imaging device.

Next, as shown in FIG. 15, a multilayer interconnection layer 59 that has plural interconnections through an interlayer insulating layer 57 is formed on the surface of the substrate. In addition, a supporting substrate 60 composed of, for example, silicon is bonded to the top of the multilayer interconnection layer 59.

Next, the thickness of the n-type semiconductor substrate 31 is reduced by grinding the back side of the substrate 31. By reducing the thickness of the substrate 31, the element separating region 25 composed of the p-type semiconductor region reaches the back side of the substrate 31, thereby covering the side of the thinned substrate completely. This back side of the substrate, which is opposite to the surface on which the readout gate electrode 23 is formed, will be used for forming a light entrance surface.

Figure 16:
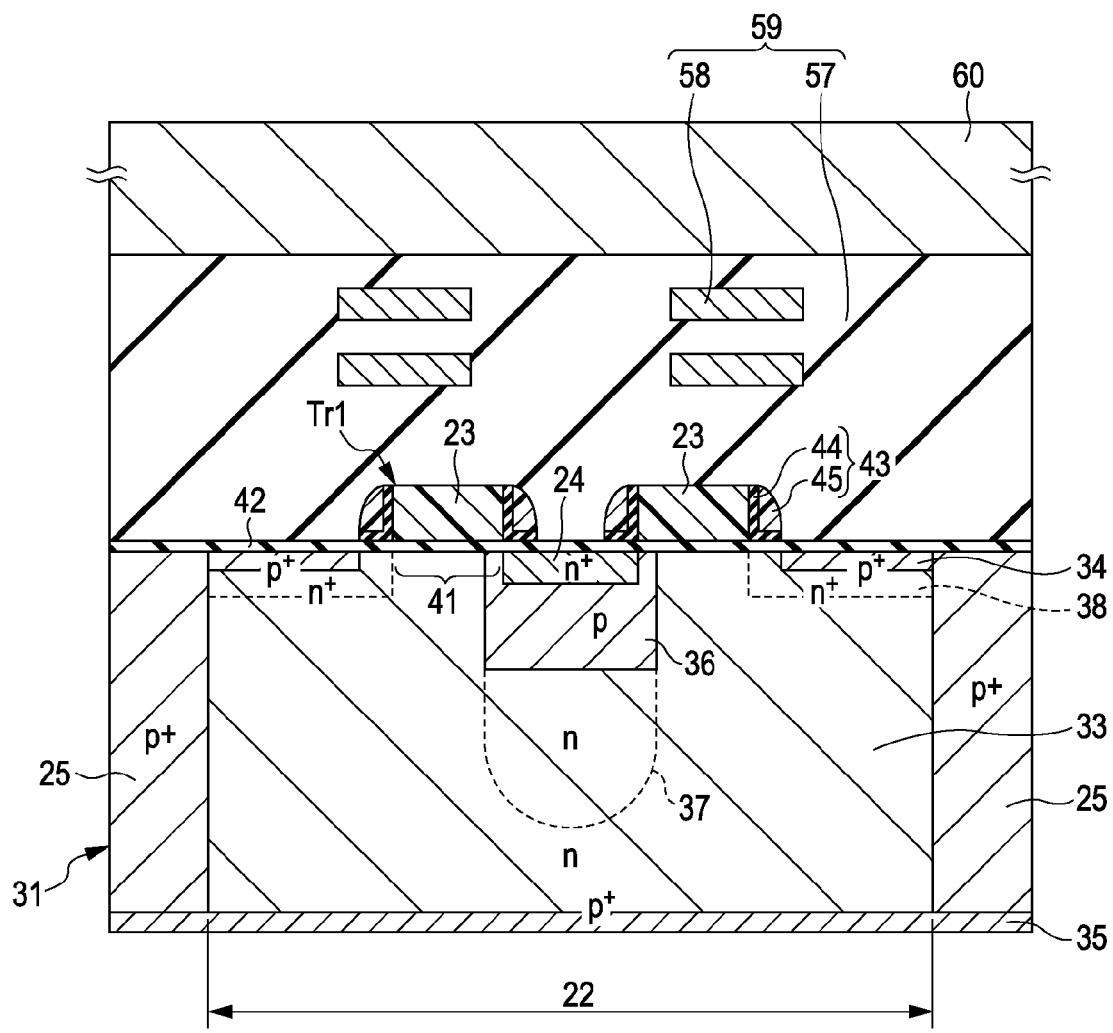
FIG. 16 is a manufacturing process diagram showing an example of a method for manufacturing the solid-state imaging device.
Figure 17:
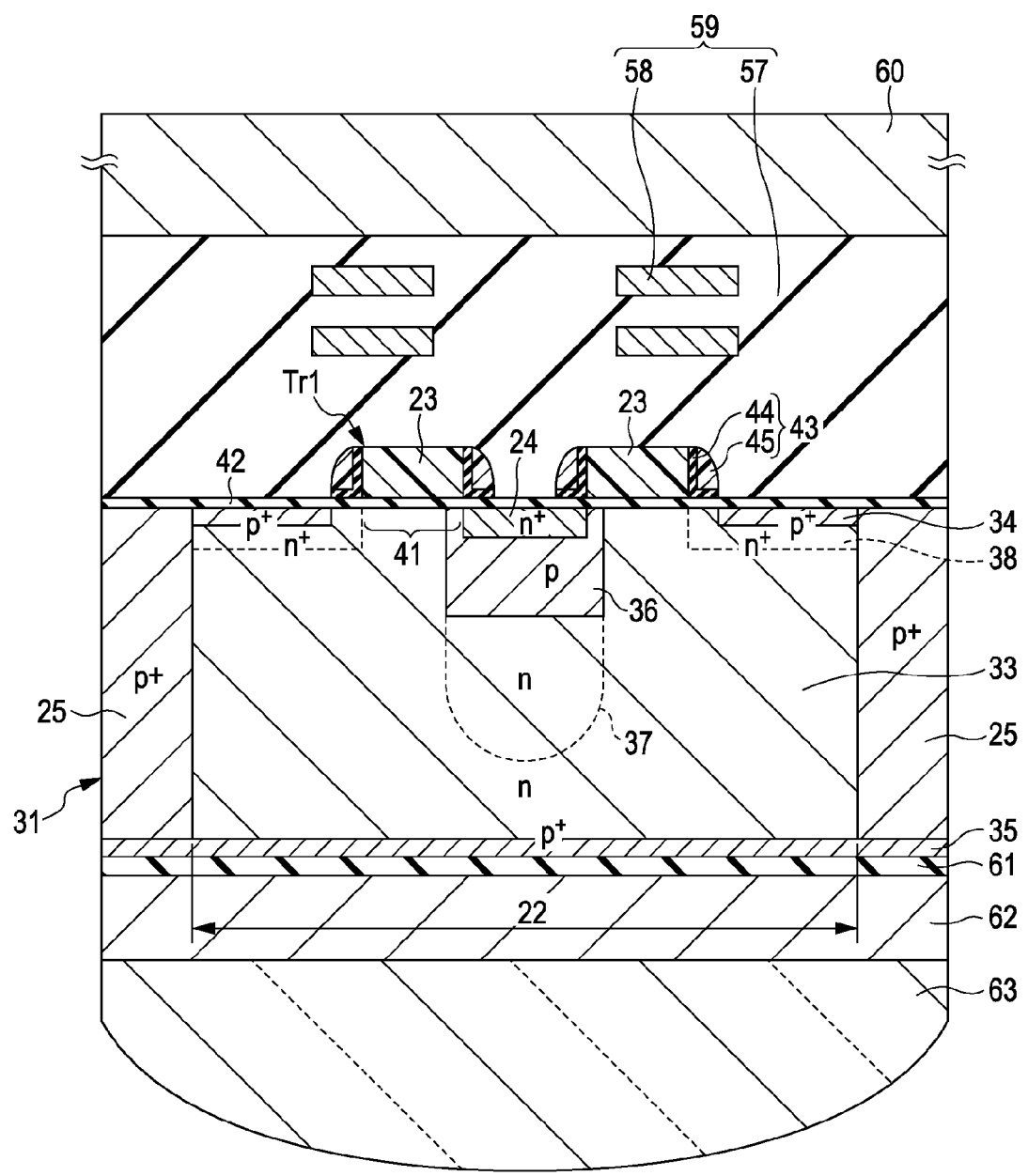
FIG. 17 is a manufacturing process diagram showing an example of a method for manufacturing the solid-state imaging device.

Next, as shown in FIG. 16, a p-type semiconductor region 35 is formed on the back side of the substrate. Furthermore, as shown in FIG. 17, an on-chip color filter 62 and an on-chip microlens 63 are formed on the back side of the substrate through an insulating layer 61, with the result that the solid-state imaging device 21 can be obtained. In addition, although a peripheral circuit section composed of CMOS transistors and the like are formed outside the pixel section, the steps of forming the peripheral circuit section are similar to commonly used steps, so that the explanation of the steps are omitted.

The method for manufacturing a solid-state imaging device according to this embodiment enables a floating diffusion element and its associated components to be formed by self-alignment. To put it concretely, the floating diffusion element 24, the p-type semiconductor well region 36, the p-type semiconductor region of the photodiode 22 can be formed with a high degree of accuracy by self-alignment. Therefore, with the method for manufacturing a solid-state imaging device according to this embodiment, the solid-state imaging device, which has advantages that signal charge is easily read out, the generation of residual images is reduced, and the amount of saturation signal charge Qs is increased, can be manufactured without fail.

Figure 18:
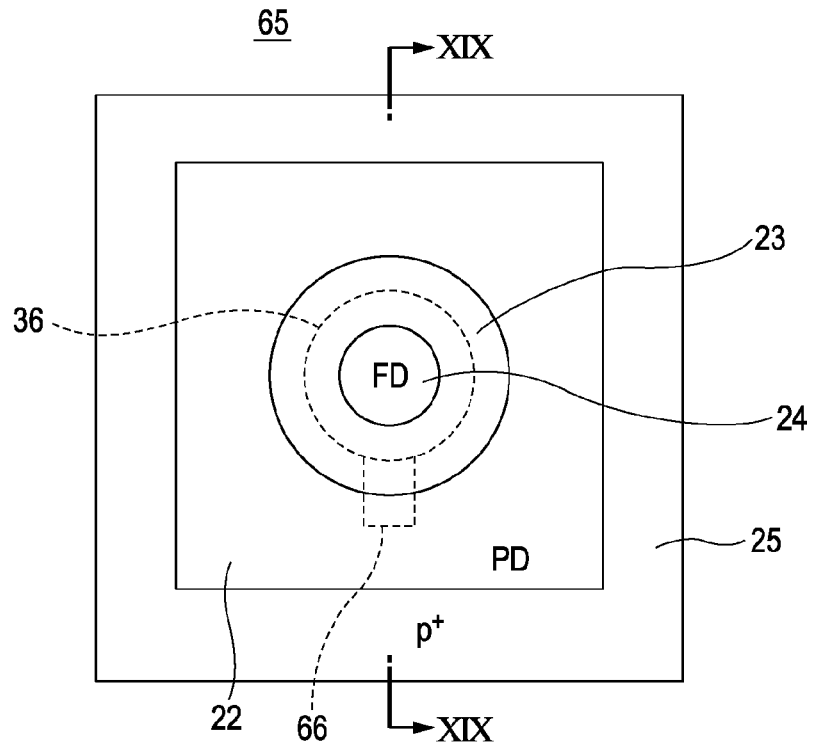
FIG. 18 is a schematic configuration diagram showing the main portion of a solid-state imaging device.
Figure 19:
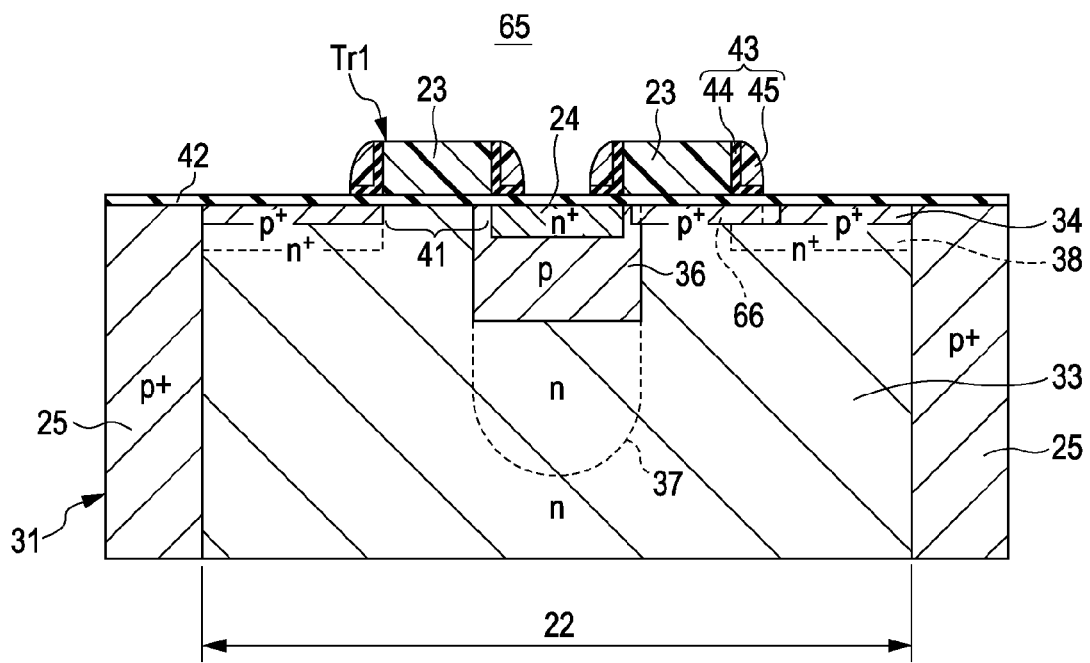
FIG. 19 is a cross-sectional view taken along the line XIX-XIX of FIG. 18.

FIG. 18 and FIG. 19 show a solid-state imaging device according to another embodiment of the present invention, that is, a MOS solid-state imaging device according to a second embodiment. FIG. 18 is a diagram showing a schematic plane structure (layout) of a pixel composed of a photodiode, a floating diffusion element, and a readout transistor. FIG. 19 is a cross-sectional view of the schematic structure of the pixel taken along the line XIX-XIX of FIG. 18. This embodiment is an example of a back-illuminated type solid-state imaging device to which the present invention is applied.

In the solid-state imaging device 65 according to the second embodiment, a connection region 66 is formed under a part of a readout electrode 23 of ring-like shape in order to connect a p-type semiconductor well region 36 to a p-type semiconductor region 34 of the photodiode 22 so that the potential of the p-type semiconductor well region can be fixed. This connection region 66 can be formed of a p-type semiconductor region by oblique ion-implantation. Because other configurations are the same as those of the first embodiment, the same referential numerals are given to the same portions in FIG. 18 and in FIG. 19 as those in FIG. 2 and in FIG. 3 respectively, and the explanations regarding the portions are omitted.

In the solid-state imaging device 65 according to the second embodiment, the p-type semiconductor region 34 of the photodiode 22 and the p-type semiconductor well region 36 that surrounds the floating diffusion element 24 are electrically connected by the p-type connection region 66. Because the p-type semiconductor region 34 is given the ground potential, the p-type semiconductor well region 36 is fixed to the ground potential through the p-type semiconductor region 34 and the p-type connection region 66.

Therefore, even if an applied voltage to the readout gate electrode 23 changes from a negative bias voltage to a positive readout voltage, the potential of the p-type semiconductor region 36 under the floating diffusion element 24 is fixed to the ground potential and stable.

The solid-state imaging device according to the second embodiment has the same advantages as explained regarding the solid-state imaging device according to the first embodiment in that a readout distance can be shortened, signal charge can be easily read out, the generation of residual images can be reduced, and the amount of saturation signal charge Qs can be increased.

Also in the configuration of the pixel described before in FIG. 5, the potential of the p-type semiconductor well region 36 is fixed. In this case shown in FIG. 5, the readout gate electrode 23 has the absent part 23A, and the absent part 23A is filled with the extension portion of the p-type semiconductor region 34 of the photodiode 22. This extension portion of the p-type semiconductor region 34 is in effect connected to the p-type semiconductor well region 36. Therefore, the ground potential is applied to the p-type semiconductor well region 36 through this p-type semiconductor region 34, so that the potential of the p-type semiconductor well region 36 is fixed to the ground potential.

Figure 20:
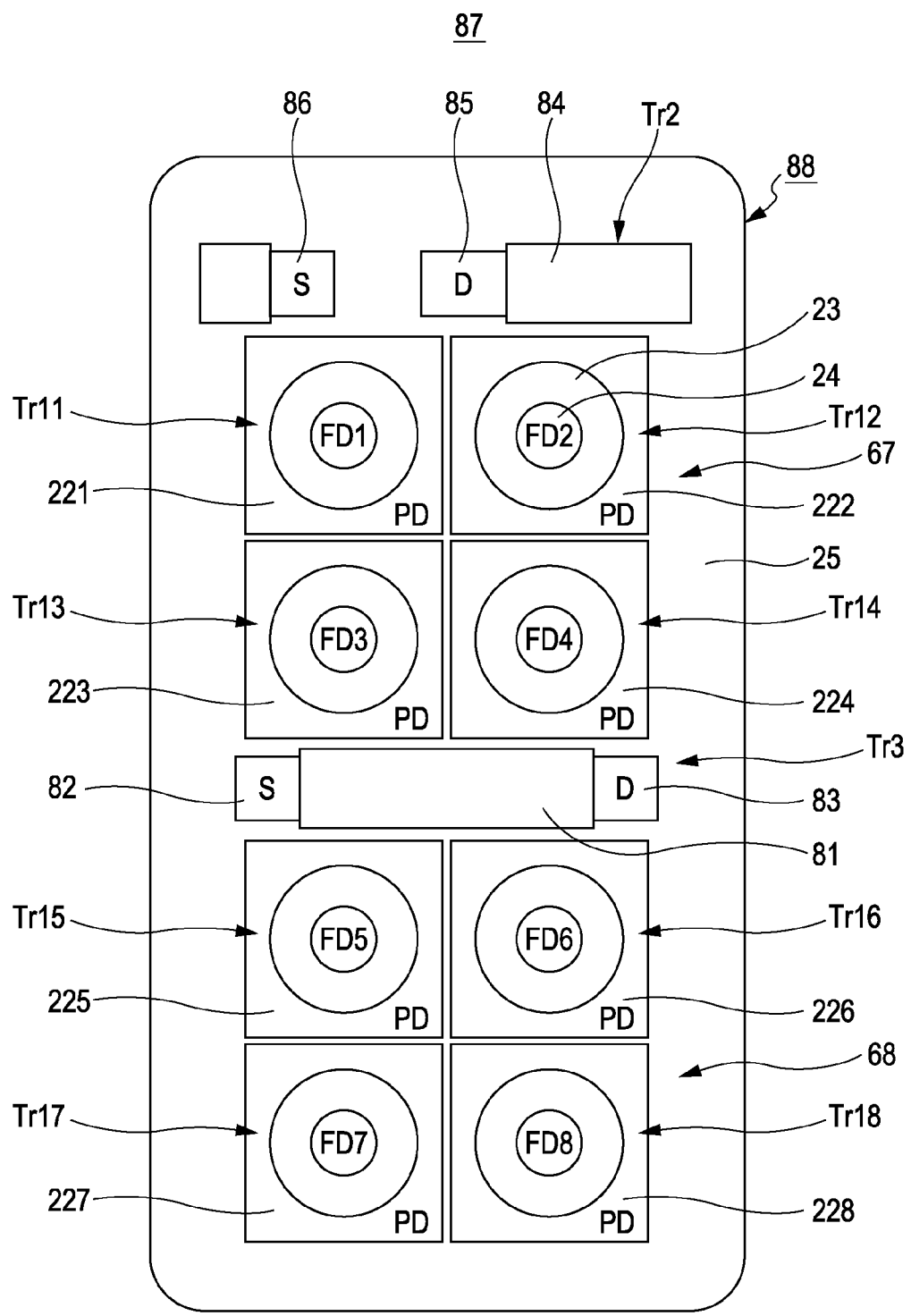
FIG. 20 is a schematic configuration diagram showing the main portion of a solid-state imaging device.

FIG. 20 shows a solid-state imaging device according to another embodiment of the present invention, that is, a MOS solid-state imaging device according to a third embodiment. FIG. 20 shows the main portion of the layout of a pixel section according to the third embodiment of the present invention. This embodiment is an example of a back-illuminated type solid-state imaging device to which the present invention is applied.

The pixel section of a solid-state imaging device 87 according to the third embodiment is composed of plural sharing units arranged in a two-dimensional array, where, as shown in FIG. 20, each sharing unit 88 includes eight pixels, which are composed of photodiodes (PD) 22[211 to 228], arranged in a two-dimensional array with 4 rows and 2 columns. Each photodiode 22 has a similar configuration to that of the first embodiment. To put it concretely, each photodiode 22 has a readout gate electrode 23 of ring-like shape and a floating diffusion element 24 disposed so as to be surrounded by the readout gate electrode 23 in its region.

The sharing unit includes a first component section 67 composed of four photodiodes (PD) 221 to 224 and a second component section 68 composed of four photodiodes (PD) 225 to 228, where each of the component sections is arranged in a 2-by-2 array, and one amplifying transistor Tr3 is disposed between these component sections. Furthermore, one rest transistor Tr2 is disposed over the first component section 67 as shown in FIG. 20. The amplifying transistor Tr3 is composed of a amplifying gate electrode 81, an n-type source region 82 and an n-type drain region 83, and has a horizontally long structure. The reset transistor Tr2 is composed of a reset gate electrode 84, an n-type source region 86 and an n-type drain region 85, and has a horizontally long structure. Here, the reset transistor Tr2 is formed across the right side neighboring sharing unit 88 as shown in FIG. 20. In addition, a drain region 85 that is a part of a reset transistor of the left side neighboring sharing unit 88 is depicted in FIG. 20.

The reset transistor Tr2 and the amplifying transistor Tr3 are shared by eight pixels of the sharing unit 88. In other words, one sharing unit 88 is composed of eight photo diodes and ten pixel transistors. The ten pixel transistors can be broken down into eight readout transistors Tr11 to Tr18, one reset transistor Tr2, and one amplifying transistor Tr3.

Each of the photodiodes 221 to 228, the amplifying transistor Tr3, and the reset transistor Tr2 are isolated from each other by an element separating region 25 composed of a p-type semiconductor region. Because other configurations shown by the cross-sectional view of each of the photodiodes 221 to 228 are the same as those described in FIG. 2 and FIG. 3, the explanations are omitted.

Plural sharing units 88 are arranged in a two-dimensional array, and a reset transistor is formed between two sharing units 88 that lie laterally adjacent to each other in such a manner that two sharing units share a gate electrode 84 and one sharing unit provides a source region 86 and the other provides a drain region 85. This reset transistor Tr2 and a amplifying transistor Tr3 are used for eight pixels located in one sharing unit 88.

Figure 21:
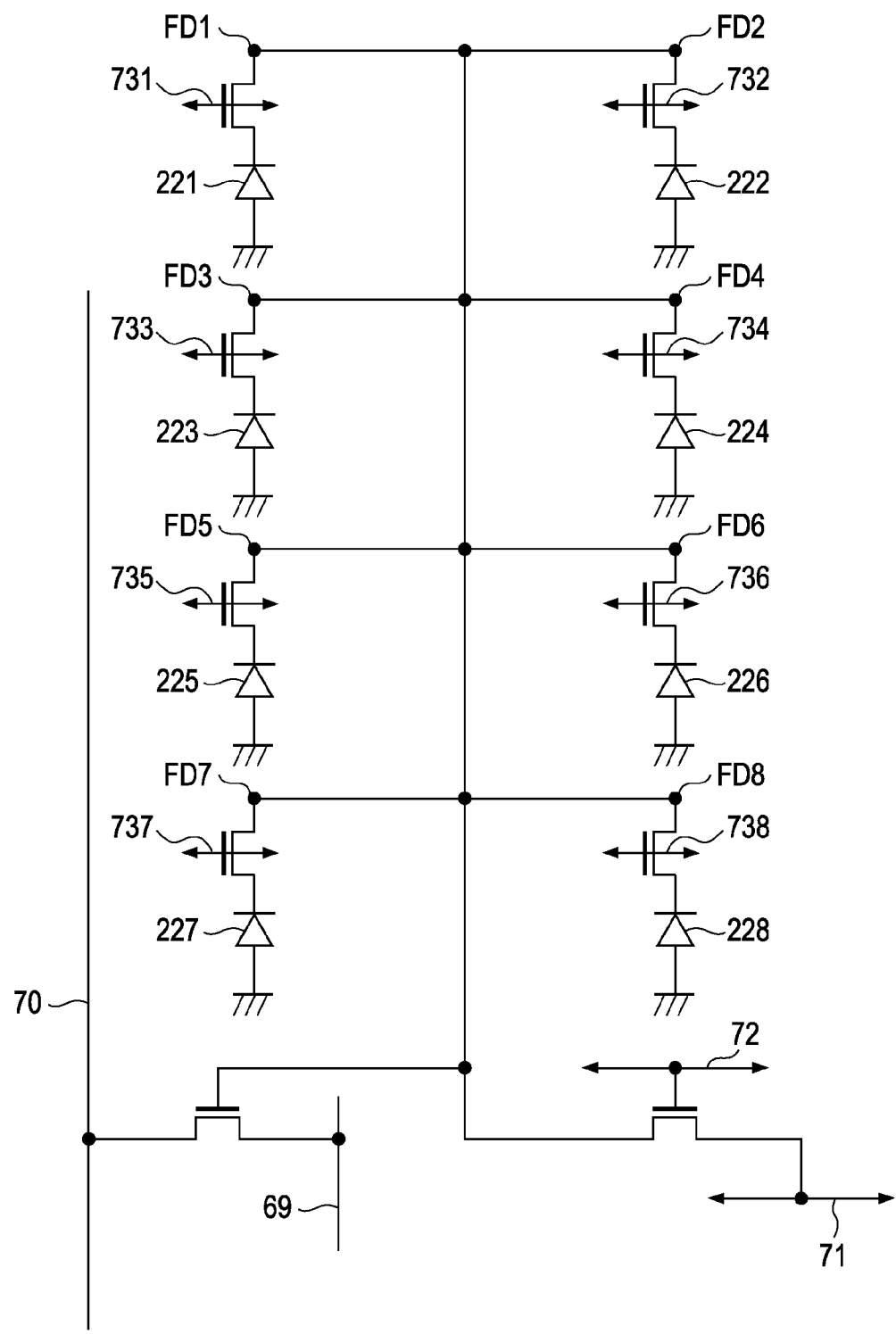
FIG. 21 is an equivalent circuit of a sharing unit

FIG. 21 is an equivalent circuit of the sharing unit 88 composed of eight pixels and ten transistors. The eight photodiodes 22[221 to 228] of the first component section 67 and the second component section 68 are connected to the sources of the corresponding readout transistor Tr11 and Tr18 respectively. The drains of the readout transistors Tr11 to Tr18, that is, the floating diffusion element(FD) 24 (represented by FD1 to FD8, and independent from each other) are connected to the gate of the amplifying transistor Tr3 shared by the eight pixels. Furthermore, the floating diffusion elements FD1 to FD8 are connected to the source of the reset transistor Tr2 shared by the eight pixels. The source of the amplifying transistor Tr3 is connected to a vertical signal line 70, and the drain of the amplifying transistor Tr3 is connected to a power supply line 69. The drain of the reset transistor Tr2 is connected to a power supply line 71, and the gate of the reset transistor Tr2 is connected to a reset connection 72 to which a reset pulse is applied. The gates of the readout transistors Tr11 to Tr18 are respectively connected to readout connections 731 to 738 to which readout pulses, which are independent from each other, are applied.

The arrangement of color filters used in the four pixels of the first component unit or the second component unit can be a Bayer array composed of three primary color filters (red, green, and blue filters). For other arrangements, various types of arrays can be employed such as an array composed of four color filters (red, green, blue, and white filters), an array composed of complementary color filters, and an array composed a combination of complementary color filters and primary color filters.

In the solid-state imaging device 87 according to the third embodiment, one floating diffusion element 24 and one readout gate electrode 23 are formed in the region of each of the photodiodes 22[221 to 228] that constitute the pixels of one sharing unit 88. Therefore, in one sharing unit 88, signal charge to be transferred from the photodiode 22 of each pixel to the corresponding floating diffusion element 24 can be easily read out as described above, while any parts of the signal charge are not left alone without being read out. At the same time, because the potential of the charge storage region of the photodiode 22 can be set to be deeper and this embodiment is an example of a back-illuminated type solid-state imaging device, the amount of saturation signal charge Qs can be increased.

Because one sharing unit 88 is composed of eight pixels and ten transistors, the number of the transistors per pixel becomes small, so that the area of a light-receiving surface of each of the photodiode 221 to 228 becomes large by just that much. Therefore, even if the sharing unit 88 is miniaturized, the sensitivity of each pixel does not deteriorate significantly, with the result that a solid-state imaging device with high sensitivity, high quality and high resolution can be obtained.

In this third embodiment, the description has been made under the assumption that one sharing unit includes eight pixels having photodiodes arranged in a 4-by-2 array. However, it goes without saying that the sharing unit can have a plurality of pixels arranged in no particular array. For example, the sharing unit can have twelve pixels having photodiodes arranged in a 6-by-2 array, sixteen pixels having photodiodes arranged in a 8-by-2 array, or 8 n pixels having photodiodes arranged in a 4 n-by-2 array (n is a positive integer number) can be adopted as one sharing unit.

The layout of the array of the pixels that constitute this embodiment is not limited to the above-described examples, and various types of arrays such as an array of a component-shared-by-two-pixels structure, an array of a component-shared-by-plural-pixels structure, a square-shaped array of pixels, and an oblique array of pixels.

A solid-state imaging device according to another embodiment of the present invention, that is, a MOS solid-state imaging device according to a fourth embodiment is an example of a front-illuminated type solid-state imaging device. Although not shown in the figure, in the solid-state imaging device according to the fourth embodiment, fundamentally as described before, pixels, each of which has a floating diffusion element 24 and a readout gate electrode 23 surrounding the floating diffusion element 24 in the region of a photodiode 22, are arranged in a two-dimensional array. For each pixel, a multilayer interconnection layer that has plural layer interconnections is formed on the surface of the substrate on which a readout transistor with the readout gate electrode 23 and other pixel transistors have been formed. The interconnections are formed for regions except for the region of the photodiode including the floating diffusion element 24. Furthermore, an on-chip color filter and an on-chip microlens are built up in this order on the multilayer interconnection layer through a planarizing film.

In the front-illuminated solid-state imaging device according to the fourth embodiment, because the floating diffusion element 24 is disposed so as to be surrounded by the photodiode 22, a readout distance from the peripheral edge of the photodiode 22 to the floating diffusion element 24 is shortened. Therefore, signal charge stored in the photodiode can be easily read out to be transferred to the floating diffusion element, and the generation of the residual images is reduced. In addition, because the readout gate electrode 23 is formed in a ring-like shape, the gate width W can be set to be large, and the signal charge can be more easily read out. Because the signal charge can be easily read out, a potential well used for storing the charge of the photodiode can be set to be deeper, and the amount of saturation signal charge Qs can be larger.

In the solid-state imaging devices according to the above-described embodiments of the present invention, although it is assumed that signal charge is composed of electrons, the signal charge can be composed of holes. In this case, it is necessary for each semiconductor region to be formed of the opposite conductivity type material.

A solid-state imaging device according to the embodiments of the present invention can be applied to electronic apparatuses. For example, a solid-state imaging device according to an embodiment of the present invention can be applied to electronic apparatuses such as a digital still camera equipped with a solid-state imaging device, a digital video camera equipped with a solid-state imaging device, a single-lens reflex camera equipped with a solid-state imaging device, a mobile device equipped with a camera, and other apparatuses equipped with a solid-state imaging device.

Additionally, the pixel according to the various embodiments of the invention can be used in an electronic device. The pixel according to the embodiments of the invention can also be used in an electronic device that has an imaging function.

Figure 22:
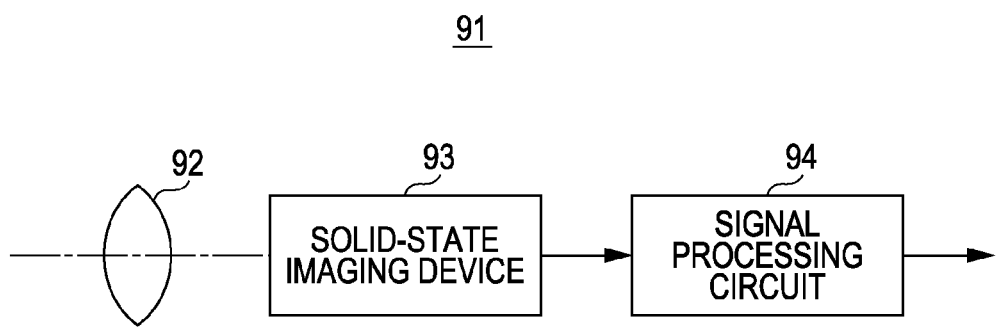
FIG. 22 is a schematic configuration diagram of an electronic apparatus according to an embodiment of the present invention.
Figure 23:
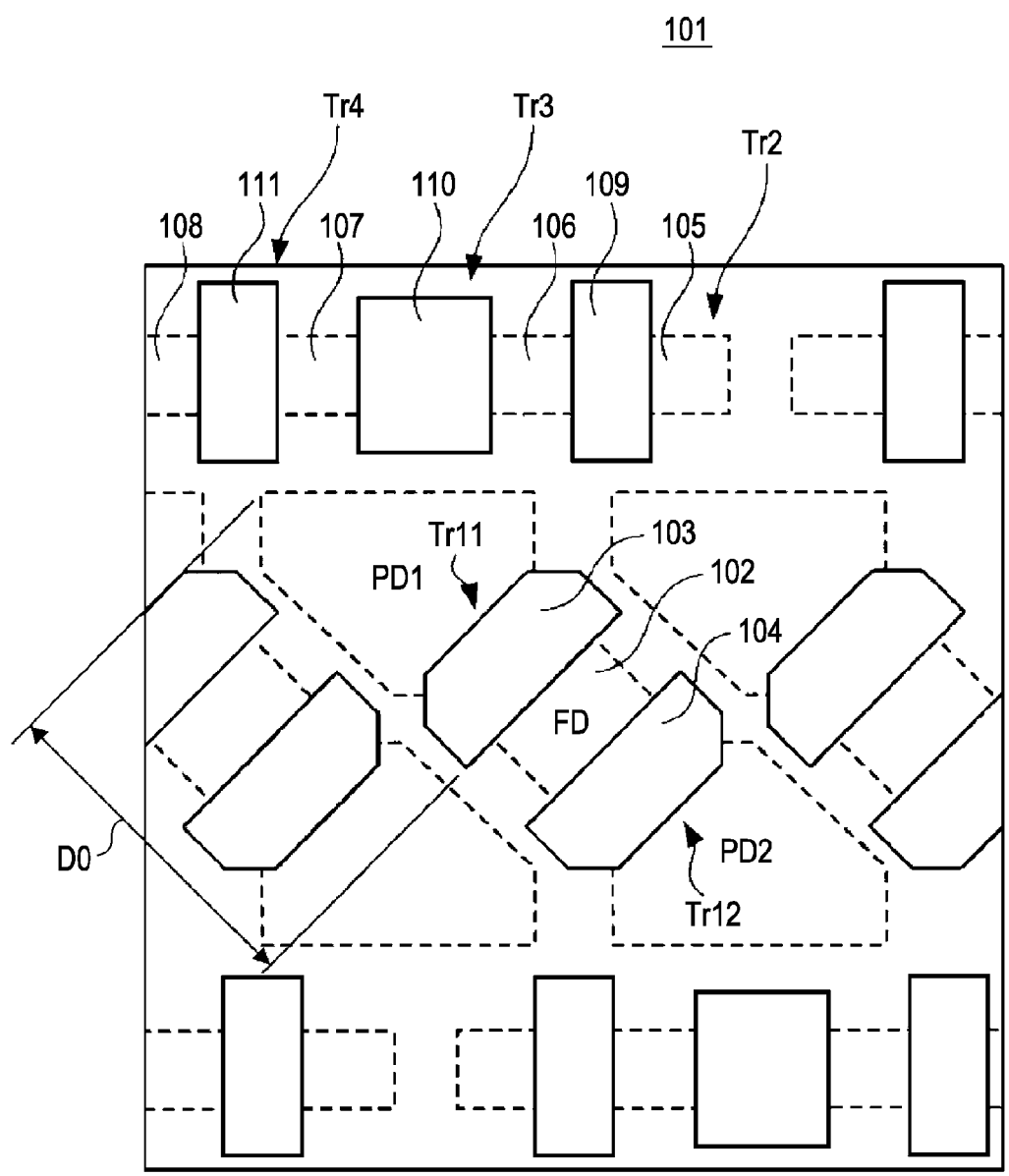
FIG. 23 is a schematic configuration diagram showing the main portion of a solid-state imaging device according to the related art.

FIG. 22 is a block diagram of a camera as an example of an electronic apparatus to which an embodiment of the present invention is applied. A camera 91 according to this embodiment includes an optical system (an optical lens) 92, a solid-state imaging device 93, and a signal processing circuit 94. Any of the solid-state imaging devices according to the above-described embodiments can be adopted as the solid-state imaging device 93. The optical system 92 focuses image light from an object (incident light) into an image on the imaging surface of the solid-state imaging device 93. This causes signal charge to be accumulated for a certain period in photodiodes that are photoelectric conversion elements of the solid-state imaging device 93. The signal processing circuit 94 performs various types of signal processing on signals output from the solid-state imaging device 93, and outputs the processed signals. In addition, there is a case where the camera 91 according to this embodiment is a modular camera in which all of the optical system 92, the solid-state imaging device 93, and the signal processing circuit 94 are modularized in an all-in-one structure.

Not only the camera shown in FIG. 22, but also a mobile device equipped with a modular camera as typified by a cellular phone can be configured with the use of this embodiment of the present invention. In addition, the configuration shown in FIG. 22 can be realized as a module in which all of the optical system 92, the solid-state imaging device 93, and the signal processing circuit 94 are modularized in an all-in-one structure, that is, a so-called imaging function module. This embodiment of the present invention enables an electronic apparatus equipped with such an imaging function module to be configured.

Because the electronic apparatus according to this embodiment is equipped with the above-described solid-state imaging device, the signal charge stored in the photodiodes of the solid-state imaging device can be easily read out, the occurrence of a residual image can be reduced, and the amount of saturated signal charge Qs can be increased. Therefore, the quality of the images taken by the apparatus is excellent, and the sensitivity of the apparatus is superior, with the result that the electronic apparatus of high quality can be provided.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising at least one pixel, the pixel further comprising:
    a photodiode;
    a floating diffusion element partially embedded in a first well region of the photodiode, the first well region at least partially abutting a second well region; and
    a read out gate electrode coupled to a first surface of a substrate and at least partially surrounding the floating diffusion element in plan view, but not overlapping the floating diffusion element in plan view,
    wherein the floating diffusion element is centered in the read out gate electrode,
    wherein the second well region is within an n-type semiconductor region,
    wherein the n-type semiconductor region lies between the second well region and a second, light incident surface of the substrate,
    wherein a seperating region extends from a first surface of the substrate to a first surface of a first semiconductor region, the first semiconductor region being coupled to the first surface of the substrate;
    wherein the n-type semiconductor region extends from the first surface of the substrate to the second surface of the substrate, and wherein the first well region and the second well region are symmetric about the floating diffusion element.

2. The solid-state imaging device according to claim 1, wherein the read out gate electrode effectively surrounds the floating diffusion region in plan view.

3. The solid-state imaging device of claim 1, wherein the read out gate electrode completely surrounds the floating diffusion region in plan view.

4. The solid-state imaging device according to claim 3, further comprising:
    a connection region under a portion of the read out gate electrode so as to connect the first conductive type semiconductor well region to the another first conductive type semiconductor region.

5. The solid-state imaging device according to claim 1, wherein the read out gate electrode has a ring shape in plan view.

6. The solid-sate imaging device according to claim 5, wherein the ring shape is uniform in width throughout.

7. The solid-state imaging device according to claim 5, wherein a portion of the ring-shape is missing.

8. The solid-state imaging device according to claim 1, wherein the read out gate electrode has a quadrangular shape in plan view.

9. The solid-state imaging device of claim 8 wherein the read out gate has a rectangular shape in plan view.

10. The solid-state imaging device according to claim 8, wherein each corner of the quadrangular shape has a rounded edge in plan view.

11. The solid-state imaging device according to claim 1, wherein the read out gate electrode is in a central region of the photodiode.

12. The solid-state imaging device according to claim 1, wherein the floating diffusion element is at an optical center of the photodiode.

13. The solid-state imaging device according to claim 1, wherein a semiconductor well region is below the surface of the photodiode so as to be surrounded by the photodiode.

14. The solid-state imaging device according to claim 13, wherein the floating diffusion region is surrounded by the p-type semiconductor well.

15. The solid-state imaging device according to claim 1, wherein the solid- state imaging device is a back-illuminated device in which incident light enters from a surface of the photodiode that is facing away from the read out gate electrode.

16. The solid-state imaging device according to claim 1, wherein the photodiode is a first conductive type semiconductor and a second conductive type semiconductor well region is below a central region of the photodiode so as to be surrounded by
    the first conductive type semiconductor region.

17. The solid-state imaging device according to claim 1, further comprising:

a separating region on each side of the photodiode; and
additional transistors within one or both of the separating regions.

18. The solid state imaging device according to claim 1, including a pixel section composed of a plurality of sharing units, each sharing unit comprising:
a first component section having a plurality of pixels;
a second component section having a plurality of pixels; and
an amplifying transistor disposed between the first and second component sections.

19. The solid-state imaging device of claim 1, wherein the first surface of the first semiconductor region is located below the first surface of the substrate.

20. The solid-state imaging device of claim 1, wherein the first surface of the first semiconductor region is located at the juxaposition of the first semiconductor region and a second semiconductor region.

21. The solid-state imaging device of claim 1, wherein the read out gate electrode is surrounded by a sidewall formed of an insulating layer.

22. An electronic apparatus including a pixel, the pixel further comprising:
a photodiode;
a floating diffusion element partially embedded in a first well region of the photodiode, the first well region at least partially abutting a second well region;
a read out gate electrode coupled to a first surface of a substrate and at least partially surrounding the floating diffusion element in plan view but not overlapping the floating diffusion element in plan view, wherein the floating diffusion element is centered in the read out gate electrode,
wherein the second well region is within an n-type semiconductor region,
wherein the n-type semiconductor region lies between the second well region and a second, light incident surface of the substrate, and
wherein a seperating region extends from a first surface of the substrate to a first surface of a first semiconductor region, the first semiconductor region being coupled to the first surface of the substrate;
wherein the n-type semiconductor region extends from the first surface of the substrate to the second surface of the substrate, and wherein the first well region and the second well region are symmetric about the floating diffusion element.

* * * * *